(12) United States Patent
Tsukao et al.

(10) Patent No.: US 11,694,988 B2
(45) Date of Patent: Jul. 4, 2023

(54) ANISOTROPIC CONDUCTIVE FILM

(71) Applicant: DEXERIALS CORPORATION, Tokyo (JP)

(72) Inventors: Reiji Tsukao, Utsunomiya (JP); Masaki Taniguchi, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 17/264,907

(22) PCT Filed: Aug. 7, 2019

(86) PCT No.: PCT/JP2019/031283
§ 371 (c)(1),
(2) Date: Feb. 1, 2021

(87) PCT Pub. No.: WO2020/032150
PCT Pub. Date: Feb. 13, 2020

(65) Prior Publication Data
US 2021/0305195 A1    Sep. 30, 2021

(30) Foreign Application Priority Data

Aug. 8, 2018  (JP) ................................. 2018-149702
Aug. 7, 2019  (JP) ................................. 2019-145850

(51) Int. Cl.
*H01L 23/00* (2006.01)
(52) U.S. Cl.
CPC ............. *H01L 24/29* (2013.01); *H01L 24/32* (2013.01); *H01L 24/83* (2013.01);
(Continued)

(58) Field of Classification Search
CPC ......... H01L 24/29; H01L 24/32; H01L 24/83; H01L 2224/29005; H01L 2224/2957;
(Continued)

(56) References Cited

U.S. PATENT DOCUMENTS

2016/0270225 A1    9/2016  Shinohara
2018/0301432 A1   10/2018  Shinohara
(Continued)

FOREIGN PATENT DOCUMENTS

JP    H09-320345 A    12/1997
JP    2014-192051 A   10/2014
(Continued)

OTHER PUBLICATIONS

Oct. 8, 2019 International Search Report issued in International Patent Application No. PCT/JP2019/031283.
(Continued)

*Primary Examiner* — Douglas W Owens
(74) *Attorney, Agent, or Firm* — Oliff PLC

(57) ABSTRACT

An anisotropic conductive film in which conductive particles are disposed in an insulating resin layer has a particle disposition of the conductive particles such that a first orthorhombic lattice region being formed by arranging a plurality of arrangement axes of the conductive particles, disposed in an a direction at a predetermined pitch, in a b direction inclined with respect to the a direction at an angle, and a second orthorhombic lattice region being formed by arranging a plurality of arrangement axes of the conductive particles, disposed in the a direction at a predetermined pitch, in a c direction obtained by inverting the b direction with respect to the a direction are repeatedly disposed.

17 Claims, 23 Drawing Sheets

(52) U.S. Cl.
CPC ............... *H01L 2224/29005* (2013.01); *H01L 2224/2957* (2013.01); *H01L 2224/32145* (2013.01); *H01L 2224/32225* (2013.01); *H01L 2224/83203* (2013.01); *H01L 2924/301* (2013.01)

(58) Field of Classification Search
CPC .......... H01L 2224/32145; H01L 2224/32225; H01L 2224/83203; H01L 2924/301; H01L 24/92; H01L 24/05; H01L 2224/04026; H01L 2224/05553; H01L 2224/0612; H01L 24/06; H01L 2224/16227; H01L 24/73; H01L 24/16; H01L 2224/27003; H01L 24/27; H01L 24/81; H01L 2224/271; H01L 2224/2711; H01L 2224/29082; H01L 2224/2929; H01L 2224/293; H01L 2224/73204; H01L 2224/81203; H01L 2224/81903; H01L 2224/83191; H01L 2224/83192; H01L 2224/83871; H01L 2224/9211; H01L 2224/83885; H05K 3/323; H05K 2201/0221; H05K 3/32; H01R 11/01; H01R 43/00
See application file for complete search history.

(56) References Cited

U.S. PATENT DOCUMENTS

| | | | |
|---|---|---|---|
| 2019/0096843 | A1 | 3/2019 | Akutsu et al. |
| 2021/0249793 | A1* | 8/2021 | Aizaki .................... H01L 24/83 |

FOREIGN PATENT DOCUMENTS

| | | |
|---|---|---|
| JP | 2015-232660 A | 12/2015 |
| JP | 2016-066573 A | 4/2016 |
| JP | 2016-225296 A | 12/2016 |
| JP | 6187665 B1 | 8/2017 |
| JP | 2017-168465 A | 9/2017 |
| JP | 2017-204462 A | 11/2017 |
| JP | 2017-204463 A | 11/2017 |
| JP | 2018-090768 A | 6/2018 |
| JP | 2019-033060 A | 2/2019 |
| WO | 2015/076234 A1 | 5/2015 |
| WO | 2018/074318 A1 | 4/2018 |

OTHER PUBLICATIONS

Oct. 8, 2019 Written Opinion issued in International Patent Application No. PCT/JP2019/031283.
Oct. 27, 2020 International Preliminary Report on Patentability issued in International Patent Application No. PCT/JP2019/031283.
Dec. 1, 2021 Office Action issued in Chinese Patent Application No. 201980052809.X.
Nov. 23, 2022 Office Action issued in Korean Patent Application No. 10-2020-7037248.
Sep. 28, 2022 Office Action issued in Chinese Patent Application No. 201980052809.X.

* cited by examiner (X-X Cross-sectional View)

Particle Disposition of FIG. 1F

Particle Disposition of FIG. 1A

Hexagonal Lattice (Inclination Angle 15°)

Hexagonal Lattice (Inclination Angle 0°)

Experimental Example 6

Left Side Region | Center Portion | Right Side Region
of Arrangement | of Arrangement | of Arrangement Experimental Example 8

(Hexagonal Lattice, Inclination Angle 0°)

Left Side Region | Center Portion | Right Side Region
of Arrangement | of Arrangement | of Arrangement Experimental Example 9

(Hexagonal Lattice, Inclination Angle 15°)

| Left Side Region of Arrangement | Center Portion of Arrangement | Right Side Region of Arrangement |

ANISOTROPIC CONDUCTIVE FILM

TECHNICAL FIELD

The present invention relates to an anisotropic conductive film.

BACKGROUND ART

Weight reduction and flexibility have become required for substrates on which electronic components such as IC chips are to be mounted. For this reason, plastic substrates and FPCs (Flexible Printed Circuits) have been frequently used as substrates. In electronic components such as IC chips, terminal pitches are becoming finer. Therefore, there may be cases where the thermal expansion of the plastic substrate or FPC brings about a problem when the electronic components are mounted on such a substrate. Therefore, in order to reliably perform the connection of the electronic components even when the positions of the terminals are shifted due to the temperature fluctuation during mounting of the electronic components, respective terminals constituting a terminal row of the electronic components are radially arranged instead of being arranged in the same direction in the conventional art (a so-called fan-out wiring) (Patent Literature 1).

To mount electronic components thereon, an anisotropic conductive film in which conductive particles are dispersed in an insulating resin layer is widely used. In the connection of electronic components using the anisotropic conductive film, in order for the terminals of the electronic component to stably capture the conductive particles of the anisotropic conductive film even if the terminal pitches of the electronic component are becoming finer, it has been proposed that the conductive particles in the anisotropic conductive film are disposed in a lattice form such as a hexagonal lattice, and the arrangement axis is inclined with respect to the long-side direction of the terminals (Patent Literature 2). Further, it has been proposed that, as the particle disposition of the anisotropic conductive film, the conductive particles are arranged in a first direction inclined with respect to the long-side direction of the film, a plurality of particle rows arranged in the first direction are arranged in a second direction different from the arrangement direction so that the particle row in the first direction is not made linear along a single line but the particle row has a width less than 2.5 times the particle diameter of the conductive particles (Patent Literature 3). Also, there has been proposed that a unit in which conductive particles are arranged at predetermined intervals is repeatedly disposed (Patent Literatures 4 and 5).

CITATION LIST

Patent Literature

Patent Literature 1: Japanese Patent Application Laid-Open No. 2015-232660
Patent Literature 2: Japanese Patent Application Laid-Open No. Hei. 9-320345
Patent Literature 3: Japanese Patent Application Laid-Open No. 2017-168465
Patent Literature 4: Japanese Patent Application Laid-Open No. 2017-204462
Patent Literature 5: Japanese Patent Application Laid-Open No. 2017-204463

SUMMARY OF INVENTION

Technical Problem

In connecting FOGs (Film On Glass) using anisotropic conductive films, for example, a case is considered in which, as shown in FIG. 6A, respective terminals to be connected are arranged in the same direction, conductive particles 1 of the anisotropic conductive film are disposed in a hexagonal lattice, and the arrangement axis of the conductive particles 1 is inclined at an angle $\delta$ with respect to the long-side direction of the terminal 20 (a direction perpendicular to the arrangement direction x). Even in this case, however, since the resin flows between the terminals in the direction indicated by the arrow due to the thermocompression bonding at the time of connection, dense regions A of the conductive particles 1 are generated between the terminals as shown in FIG. 6B depending on the conditions after the connection, and this causes a short circuit.

Furthermore, as shown in FIG. 5A, when an anisotropic conductive film in which the conductive particles 1 are disposed in a hexagonal lattice is used to connect a terminal row of a fan-out type such that the arrangement axis of the hexagonal lattice inclines (at an inclination angle $\gamma$) with respect to the long-side direction of the film, since the fan-out angle $\beta$ (i.e., the angle of the long-side direction of the terminal 20 with respect to the terminal arrangement direction x) is slightly different for each terminal, the number and distribution state of the conductive particles 1 captured by one terminal are different between the right side and the left side of the terminal row of the fan-out type. As a result, the dents after the connection are also differently observed. In the temporal bonding state before thermocompression bonding of the terminal row, when the disposition of the conductive particles shown in the figure is adopted, the conductive particles 1 on the terminal 20a on the left side in the figure are captured only at the edge of the terminal. For this reason, there is a concern that a conduction failure may occur after the connection.

When a terminal row is connected using an anisotropic conductive film in which conductive particles are disposed in a hexagonal lattice, the number of arrangements of conductive particles, which are involved in the capturing, in the arrangement axis perpendicular to the arrangement direction x of the terminals differs from terminal to terminal. Therefore, variation in the number of conductive particles captured by one terminal is increased. In some cases, the distribution of the number of captured particles may have two peaks. This is not limited to cases using a hexagonal lattice, but can also occur in cases using a square lattice and an orthorhombic lattice. For example, as shown in FIG. 5B, the terminal 20b captures the conductive particles 1 belonging to an arrangement axis y1 perpendicular to the terminal arrangement direction x. The terminal 20c, however, captures the conductive particles 1 belonging to two arrangement axes y2 and y3. Such a phenomenon becomes more remarkable, as shown in FIG. 5C, in the case where the terminal row is not a fan-out type, but in the terminal row in which the axes of the respective terminals are arranged in the same direction. In this case, there are a certain number of the terminals 20b in which an arrangement axis y1 is involved in connection and also a certain number of the terminals 20c in which two arrangement axes y2 and y3 are involved in connection. As a result, the variation in the number of conductive particles captured by one terminal increases. Consequently, when the number of conductive particles captured by one terminal and the appearance frequency of the terminals that each capture the conductive particles by that number are plotted in a graph, there may exist multiple peaks. That is, due to a plurality of factors such as the terminal width and the inter-terminal space, and particle diameter and the inter-particle distance, two peaks, for example, may appear. Although the existence of two peaks may not immediately cause a practical problem, it becomes difficult to control the number of captured conductive particles in the individual terminals in the terminal row, which may not cause a practical problem. For example, even if the problem-free captured number is satisfied for all terminals, a case may occur in which terminals that each capture a relatively large number of particles and terminals that each capture a relatively small number of particles coexist in the terminal row. It should be noted that variations in the number of conductive particles captured by one terminal are not limited to the case of showing two peaks.

Further, by thermocompression bonding at the time of connection, the distance between the conductive particles on the terminal is greatly increased in the short-side direction as compared to that in the long-side direction of the terminal. As a result, the conductive particles on the terminal are extruded to a space between the terminals, and the conductive particles present between the terminals including the extruded conductive particles are moved by the resin flow during thermocompression bonding. As a result, the distributions of the conductive particles with respect to the terminals on the right and left sides of the terminal row are different from each other. When a dense portion of the conductive particles is formed between the terminals, there may be a problem that a short circuit is likely to occur at that portion.

The phenomenon in which conductive particles between terminals cause a short circuit due to resin flow during thermocompression bonding also occurs when straight terminals are arranged in a straight manner in the same direction (straight parallel arrangement) even if the terminal row is a radial fan-out type terminal row. To cope with this problem, it is conceivable that a photocurable resin is used for an insulating resin layer of the anisotropic conductive film to suppress the movement of the conductive particles due to the resin flow. However, if the curable resin is used to prevent the conductive particles from moving due to resin flow, the pressurization on the conductive particles tends to be insufficient at the time of thermocompression bonding. Therefore, there is a concern that a connection failure between the terminal and the conductive particles may occur. In view of this, a method described in Japanese Patent No. 6187665 is conceivable in which a filler contained in the insulating resin layer or the like is used to increase the melt viscosity of the insulating resin layer, so that the resin flow is suppressed while a sufficient pressure is applied at the time of thermocompression bonding. However, there is a demand to further prevent the occurrence of a short circuit even for the straight parallel arrangement type terminal row and the terminal row of the fan-out type. This is because it is difficult to completely prevent a short circuit of the conductive particles only by the curing property and viscosity of the insulating resin that holds the conductive particles. In particular, when a large number of connection structures are continuously produced in a production line or the like, there is a concern that the occurrence of a short circuit cannot be prevented when irregular resin flow or misalignment occurs. Furthermore, when the terminal layouts and the materials of the electronic component are diversified, it becomes more difficult to achieve both the prevention of a short circuit and securing of continuity when an optional terminal layout and an optional material of electronic components are adopted.

When the numbers of conductive particles captured by respective terminals are stabilized, and when, as described in Patent Literature 3 in order to suppress a short circuit due to resin flow, the first particle row of conductive particles is not arranged in a linear manner but a width of more than the particle diameter is given to the particle row, it is impossible to strictly control the particle disposition. This makes it difficult to keep the numbers of captured conductive particles by the respective terminals within a predetermined range. Also in this case, when irregular resin flow or misalignment occurs in the production line or the like for continuously producing the connection structures, it is difficult to keep the numbers of captured conductive particles within a predetermined range. This difficulty level increases as the number of connection structures to be continuously produced increases. Even if the particle disposition is configured such that a unit of conductive particles is repeatedly disposed as described in Patent Literatures 4 and 5, it is difficult to equalize the distribution of the conductive particles on the right and left sides of the terminal row on the fan-out side. In particular, this tendency is increased when the terminal length is shortened, and it is difficult to suppress the variation in the number of the conductive particles captured by each terminal.

In consideration of the problems described above, a problem to be solved by the present invention is to ensure a good conduction state while the respective terminals hold sufficient number of conductive particles regardless of the materials of electronic components even when the axes of the respective terminals of a terminal row to be connected are arranged in the same direction and the terminal row is arranged in a straight manner or even when the terminal row is a radial fan-out type, thereby uniformizing the capture state of the conductive particles in the terminals after connection, which can be confirmed by dents or the like, and also to prevent the occurrence of a short circuit even in the case of connecting the fine pitched terminals.

Solution to Problem

The present inventor has conceived to constitute the following disposition of conductive particles of an anisotropic conductive film where a first orthorhombic lattice region and a second orthorhombic lattice region are repeatedly disposed, the first orthorhombic lattice region being formed by an arrangement axis in an a direction and an arrangement axis in a b direction inclined with respect to the a direction at an angle α, the second orthorhombic lattice region being formed by the arrangement axis in the a direction and an arrangement axis in a c direction obtained by inverting the b direction with respect to the a direction (in other words, the arrangement axis in the c direction inclined with respect to the a direction at an angle −α). By doing so, the whole anisotropic conductive film is cause to undulate an axis direction intersecting the a direction, so that, even when the respective terminals to be connected are arranged in the same direction and even when the fan-out type is adopted, the number of the captured conductive particles and the distribution situation of the conductive particles at the respective terminals are uniformized, and it is also possible to facilitate cut-off of the continuation of the conductive particles between the terminals to suppress a short circuit. The present invention thus has been completed.

That is, the present invention provides an anisotropic conductive film in which conductive particles are disposed in an insulating resin layer, and a first orthorhombic lattice region in which a plurality of arrangement axes a1 of the conductive particles which are disposed in an a direction at a predetermined pitch are arranged in a b direction inclined with respect to the a direction at an angle α, and a second orthorhombic lattice region in which a plurality of arrangement axes a2 of the conductive particles which are disposed in the a direction at a predetermined pitch are arranged in a c direction obtained by inverting the b direction with respect to the a direction are repeatedly disposed.

In the present invention, the anisotropic conductive film refers to a film capable of forming anisotropic conductive connection. Further, the anisotropic conductive connection state refers to a state in which the opposing terminals of respective electronic components having a plurality of terminals are electrically connected, but adjacent terminals are not electrically connected to each other.

Advantageous Effects of Invention

According to the present invention, the first orthorhombic lattice region formed by the arrangement axis in the a direction and the arrangement axis in the b direction inclined with respect to the a direction at the angle α, and the second orthorhombic lattice region formed by the arrangement axis in the a direction and the arrangement axis in the c direction obtained by inverting the b direction with respect to the a direction (in other words, the arrangement axis in the c direction inclined with respect to the a direction at the angle −α) are repeatedly disposed, so that, as the whole anisotropic conductive film, the axial direction intersecting the a direction becomes wavy in a zigzag form. Therefore, even when the terminal row of the fan-out type is connected, a large number of conductive particles in a particular terminal are connected in close proximity after the connection, and thus, it is possible to suppress the occurrence of such situations that the state of holding conductive particles between the terminals becomes difficult to see due to such a state that the appearance of the dents is thinned, and that a short circuit occurs by a number of conductive particles continuously present between the terminals.

Further, in the case of continuously performing thermocompression bonding in a production line, irregular resin flows may occur due to the thermocompression bonding performed under a temperature condition unintentionally deviated from a predetermined condition. Even in such a case, the influence therefrom can be prevented from being exerted excessively, so that it is possible to suppress a short circuit.

As described above, the appearance of the dents becomes uniform in the terminal row after the connection, and a short circuit between the terminals is suppressed. Such effects can be obtained not only when the terminal row of the fan-out type is adopted, but also when a plurality of terminals are arranged in a straight manner in the same direction.

DESCRIPTION OF EMBODIMENTS

Figure 1A:
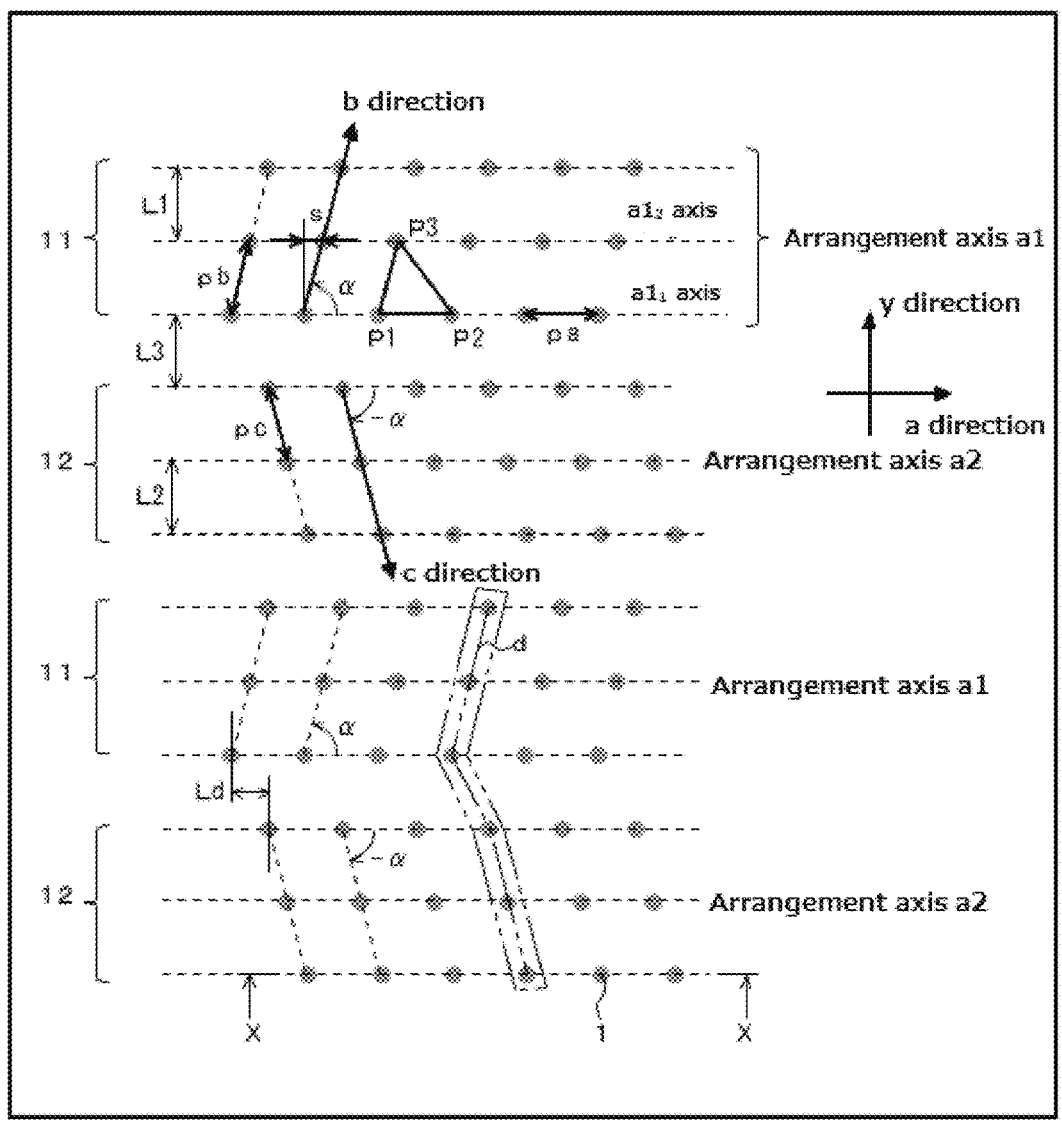
FIG. 1A is a plan view illustrating a disposition of conductive particles in an anisotropic conductive film 10A of an example.

Hereinafter, an example of an anisotropic conductive film of the present invention will be described in detail with reference to the drawings. In the drawings, the same reference numerals denote the same or equivalent components.

<Overall Configuration of Anisotropic Conductive Film>

Figure 2:
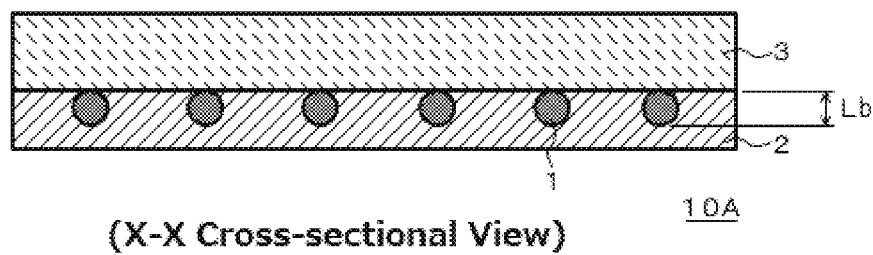
FIG. 2 is a cross-sectional view of the anisotropic conductive film 10A of the example.
Figure 3:
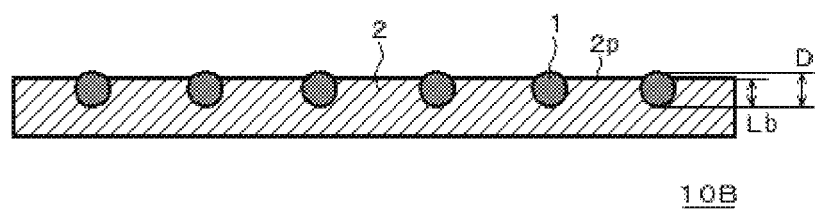
FIG. 3 is a cross-sectional view of an anisotropic conductive film 10B of an example.

FIG. 1A is a plan view illustrating a disposition of conductive particles of an anisotropic conductive film 10A of an example, and FIG. 2 is a cross-sectional view thereof taken along line X-X. The anisotropic conductive film 10A has a layer configuration in which conductive particles 1 are disposed in a single layer on or near the surface of an insulating resin layer 2, and a low-viscosity resin layer 3 is laminated thereon. In the present invention, the low-viscosity resin layer 3 is provided as necessary. As in the cross-sectional view of an anisotropic conductive film 10B shown in FIG. 3, the low-viscosity resin layer 3 may be omitted. A planar disposition of the conductive particles 1 of the anisotropic conductive film 10B may be the same as that of the anisotropic conductive film 10A having the low-viscosity resin layer 3.

The planar disposition of the conductive particles 1 in the anisotropic conductive film 10A, 10B of this example is configured such that a first orthorhombic lattice region 11 and a second orthorhombic lattice region 12 are alternately and repeatedly disposed, as will be described later. Here, the first orthorhombic lattice region 11 is an orthorhombic lattice with arrangement axes in an a direction and a b direction (angle formed between the a direction and the b direction: $\alpha$), and the second orthorhombic lattice region 12 is an orthorhombic lattice with arrangement axes in the a direction and a c direction (angle formed between the a direction and the c direction: $-\alpha$).

<Conductive Particles>

Particulate Material

Examples of the conductive particles 1 may include metal particles such as nickel, cobalt, silver, copper, gold, and palladium, alloy particles made of a solder or the like, and metal-coated resin particles. Two or more types of particles may be used in combination. Among these, the metal-coated resin particles are preferable from the viewpoint of ease of maintenance of contact with the terminals due to repulsion of the resin particles after the connection, thus stabilizing the conduction performance. The surface of the conductive particles may be subjected to an insulation treatment that does not impair the conduction characteristics. In this case, for example, insulating fine particles may be attached thereto by a known technique, or the surface thereof may be insulated by a coating of an insulating resin.

Particle Diameter

The particle diameter of the conductive particles 1 is appropriately selected in accordance with use applications. Typically, in order to suppress an increase in conduction resistance and to suppress occurrence of a short circuit, the particle diameter of the conductive particles 1 is preferably 1 µm or more and 30 µm or less. In the case of using the film for fine-pitch product, the particle diameter of the conductive particles 1 is preferably 2 µm or more and less than 10 µm. The particle diameter of the conductive particles before being dispersed in the insulating resin layer can be measured by a general particle size distribution measuring apparatus. The average particle diameter of the conductive particles can also be obtained using a particle size distribution measuring apparatus. Example of the measuring apparatus may include an imaging type FPIA-3000 (Malvern Panalytical Ltd.). In this case, it is desirable that the number of samples for measuring the conductive particle diameter be 1000 or more, and preferably 2000 or more. The particle diameter of the conductive particles in the anisotropic conductive film can be obtained from observation with an electron microscope such as SEM. In this case, it is desirable that the number of samples for measuring the conductive particle diameter be 200 or more, and preferably 1000 or more.

With respect to the variation in particle diameter, it is preferable that the CV value of the particle diameter be 20% or less. When the variation in particle diameter is small, it is possible to increase the margin of the heating and pressurizing conditions during thermocompression bonding.

It should be noted that, when a conductive particle having the surface subjected to the foregoing insulation treatment is used as the conductive particle, the particle diameter of the conductive particle in the present invention means the particle diameter not including such an insulation treated portion.

Planar Disposition

The planar disposition of the conductive particles, as illustrated in FIG. 1A, is configured such that the first orthorhombic lattice region 11 and the second orthorhombic lattice region 12 are alternately and repeatedly disposed in a y direction perpendicular to the a direction. In this example, the first orthorhombic lattice region 11 is a region in which a plurality of arrangement axes a1 in which the conductive particles 1 are disposed in the a direction at a constant pitch pa are arranged in the b direction inclined with respect to the a direction at the angle α. The second orthorhombic lattice region 12 is a region in which a plurality of arrangement axes a2 in which the conductive particles 1 are disposed in the a direction at the pitch pa are arranged in the c direction. The c direction is a direction obtained by inverting the b direction with respect to a straight line parallel to the arrangement axis of the a direction as the symmetry axis. Alternatively, the c direction is a direction inclined with respect to the a direction at an angle −α. The particle disposition can be recognized to include an arrangement d as a unit which is a bent arrangement surrounded by a two-dot chain line in FIG. 1A, the arrangement including an arrangement of the first orthorhombic lattice region 11 in the b direction and an arrangement of the second orthorhombic lattice region 12 in the c direction.

The particle pitch in the arrangement axis a2 of the second orthorhombic lattice region 12 may be made different from the particle pitch pa in the arrangement axis a1 of the first orthorhombic lattice region 11. For the convenience of designing the particle disposition, it is preferable that the pitch pa of the arrangement axis a2 be made equal to the pitch pa of the arrangement axis a1.

Figure 4A:
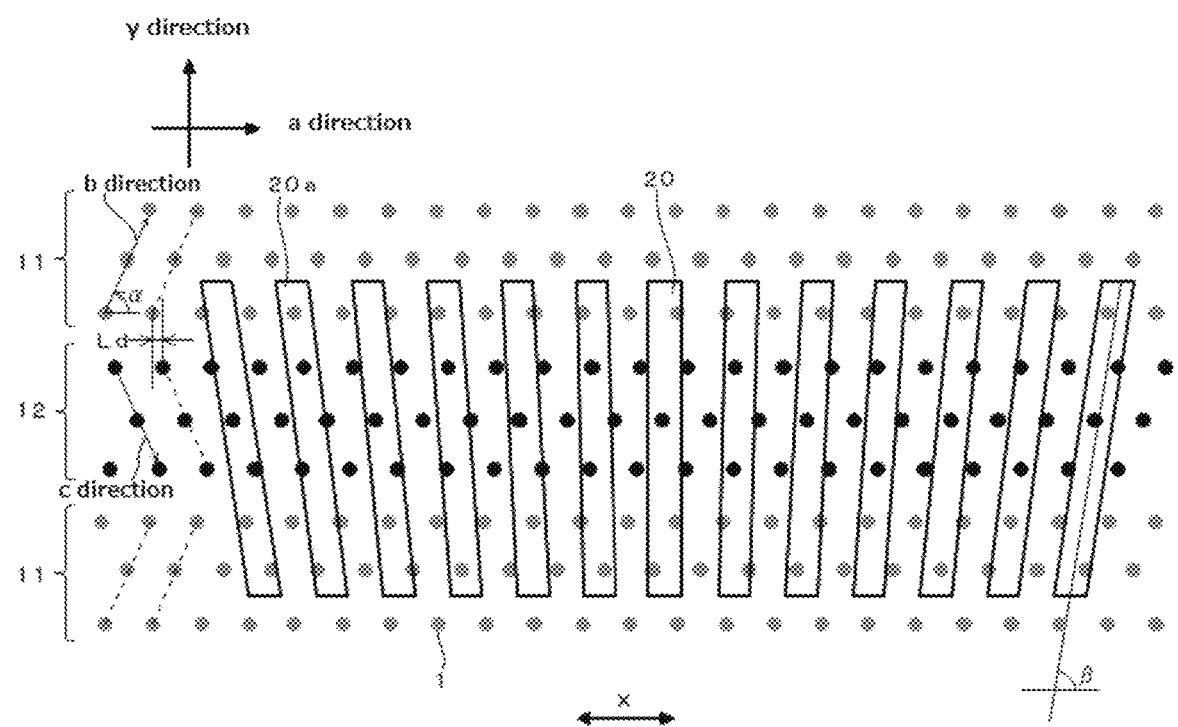
FIG. 4A is a plan view in which the anisotropic conductive film 10A of the example is overlaid on a terminal row of a fan-out type.
Figure 4B:
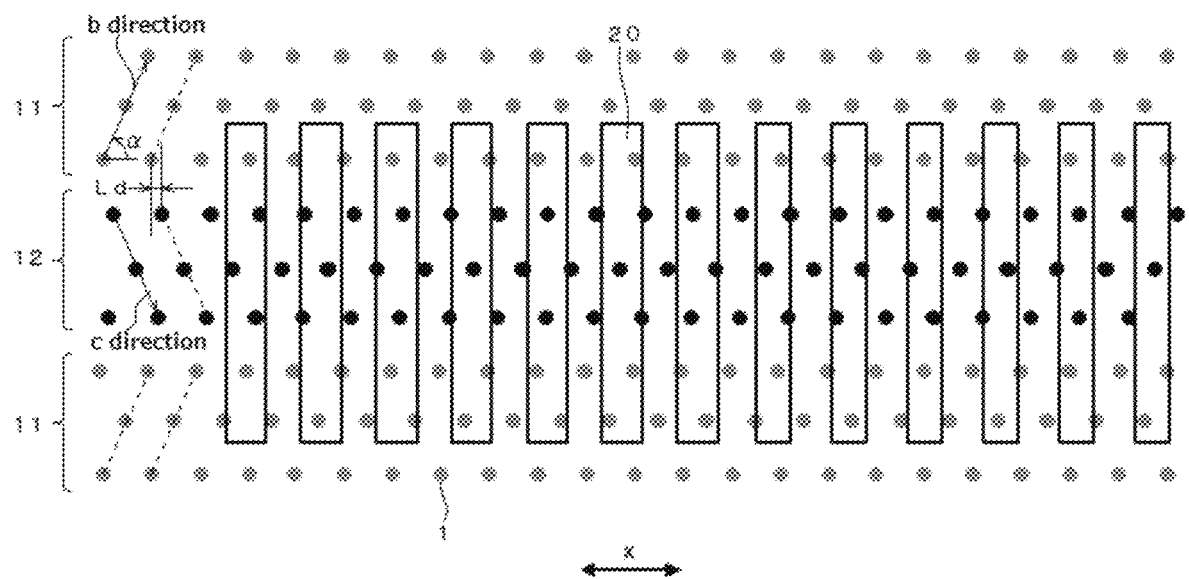
FIG. 4B is a plan view in which the anisotropic conductive film 10A of the example is overlaid on a terminal row in which terminal axes of respective terminals are arranged in the same direction.

In the disposition of the conductive particles 1 as in the present example, the first orthorhombic lattice region with the arrangement axes in the a direction and in the b direction inclined with respect to the a direction and the second orthorhombic lattice region with the arrangement axes in the a direction and in the c direction obtained by inverting the b direction are repeatedly and alternately disposed. With this configuration, even when the fan-out type terminal row as shown in FIG. 4A (i.e., the terminal row in which the angles of the terminals 20 with respect to the arrangement direction x of the terminals 20 in the long-side direction (fan-out angles β) are sequentially changed) is connected using the anisotropic conductive film, and also even when the linear terminal row in which the axes of the respective terminals are arranged in the same direction is connected as shown in FIG. 4B, the disposition of the conductive particles with respect to the respective terminals becomes uniform, and after connection, the numbers of the conductive particles captured by the respective terminals are stabilized. In contrast, when the disposition of the conductive particles in the anisotropic conductive film is made only by the first orthorhombic lattice region, or only by the second orthorhombic lattice region, variations in the number of the conductive particles captured by a terminal and the distribution state of the conductive particles at the terminal increase. At any terminal in the fan-out type terminal row, the direction of the arrangement axis of the conductive particles disposed in a lattice form in the anisotropic conductive film and the long-side direction of the terminal overlap with each other. Therefore, the property of capturing the conductive particles arranged at the edge of the terminal is rapidly reduced. Furthermore, when a particle group of a plurality of conductive particles arranged in close proximity is captured by any terminal, the dents formed by the individual conductive particles at the terminals are thinned, and a dense region of the conductive particles may be formed between the terminals. Such problems are less likely to arise in the anisotropic conductive film of the present invention.

Further, in the anisotropic conductive film of the present invention, as shown in FIG. 4A and FIG. 4B, it is preferable to set the a direction to the same direction as the arrangement direction x of the terminals. This is because the captured state of the conductive particles and the appearance of the dents are equalized between the terminal on the left side and the terminal on the right side in the drawing. Further, from the viewpoint of convenience in use of the anisotropic conductive film, it is preferable to set the a direction to the long-side direction of the anisotropic conductive film. Alternatively, it is preferable to set the arrangement direction x of the terminals to the long-side direction of the anisotropic conductive film. Furthermore, it is preferable that the number of repetitions of the first orthorhombic lattice region 11 and the second orthorhombic lattice region 12 be sufficient with respect to the length of the terminal in the long-side direction. For example, with respect to the terminal length of the terminal to be connected, the number of repetitions is preferably 1 or more, and more preferably 3 or more. In other words, it is preferable that the repetition pitch of the first orthorhombic lattice region 11 and the second orthorhombic lattice region 12 in the y direction be equal to or less than the terminal length of the terminal to be connected, or equal to or less than ⅓ the terminal length. Alternatively, the number of bends of the arrangement axis formed by the arrangement axis in the b direction of the first orthorhombic lattice region 11 and the arrangement axis in the c direction of the second orthorhombic lattice region 12 is determined so that the number of captured conductive particles at each terminal is preferably 3 or more, and more preferably 11 or more.

In the first orthorhombic lattice region 11, when the terminal row to be connected is of the fan-out type, the absolute value of the angle α formed between the a direction and the b direction is made smaller than the minimum value of the absolute value of the fan-out angle β. Thus, in any terminal constituting the terminal row, the long-side direction of the terminal and the b direction do not coincide with each other in the first orthorhombic lattice region 11. Therefore, it is possible to prevent the property of capturing the conductive particles present at the edge of the terminal in the long-side direction from being rapidly reduced, and also prevent the dents from being thinned due to a large number of conductive particles continuously connected in a row and captured on the terminal. On the other hand, when the terminal row to be connected is not a fan-out arrangement, it is preferable that the absolute value of the angle α be equal to or less than the absolute value of the angle β formed between the arrangement direction of the terminals and the long-side direction of the terminal. This is because the number of captured conductive particles is stabilized at the terminal row where the arrangement direction of the terminal is perpendicular to the long-side direction of the terminal (i.e., the angle β=90°). Also, even in the case where the angles β of 0° and 90° are adopted in combination such as in the peripheral disposition, the number of captured conductive particles is stabilized, which is preferable.

Furthermore, in the second orthorhombic lattice region 12, the c direction is a direction obtained by inverting the b direction with respect to the a direction, and the angle formed between the a direction and the c direction is −α. Since the long-side direction of the terminal and the c direction do not coincide with each other by setting the angle α also in the second orthorhombic lattice region 12 as described above, it is possible to obtain the same effect as described above.

When the angle α is 90°, the particle dispositions in the first orthorhombic lattice region 11 and the second orthorhombic lattice region 12 are in a square lattice or rectangular lattice form. Therefore, the angle α may be expressed as the strain amount s in the a direction of the square lattice or the rectangular lattice (FIG. 1A). If the strain amount s is greater than the average particle diameter, the connection in the y direction is less likely to occur in the conductive particles in the same orthorhombic lattice region during anisotropic conductive connection. On the other hand, it is preferable that the strain amount s be the average particle diameter or less, preferably less than the average particle diameter, because the conductive particles are easily captured by the terminal after anisotropic conductive connection even when the terminal width is narrow.

The angle formed by the c direction with the a direction may not be obtained by inverting the sign of the angle α in a strict sense. That is, the absolute value of the angle formed by the b direction with the a direction and the absolute value of the angle formed by the c direction with the a direction may not be exactly the same, but it may be different from each other for each orthorhombic lattice region. In this case, it is preferable that the sum of these angles in all the orthorhombic lattice regions be 0°.

Suppose a case where the center positions of conductive particles adjoining each other in the arbitrary arrangement axis $a1_1$ are represented by P1 and P2, and the center position of a conductive particle on the arrangement axis a1 ($a1_2$) adjoining the arrangement axis $a1_1$ and having the position in the a direction located between P1 and P2 is represented by P3. In this case, when ∠P3P1P2≠∠P3P2P1 is satisfied, as shown in FIG. 1A, the particle disposition of the first orthorhombic lattice region 11 and the particle disposition of the second orthorhombic lattice region 12 are line-symmetric and differ each other. Therefore, even if these regions are translated, the particle dispositions do not overlap with each other. That is, the extension of an arbitrary arrangement axis inclined with respect to the a direction in one of these orthorhombic lattice regions 11 and 12 never serves also as the arrangement axis in the other region.

Figure 1B:
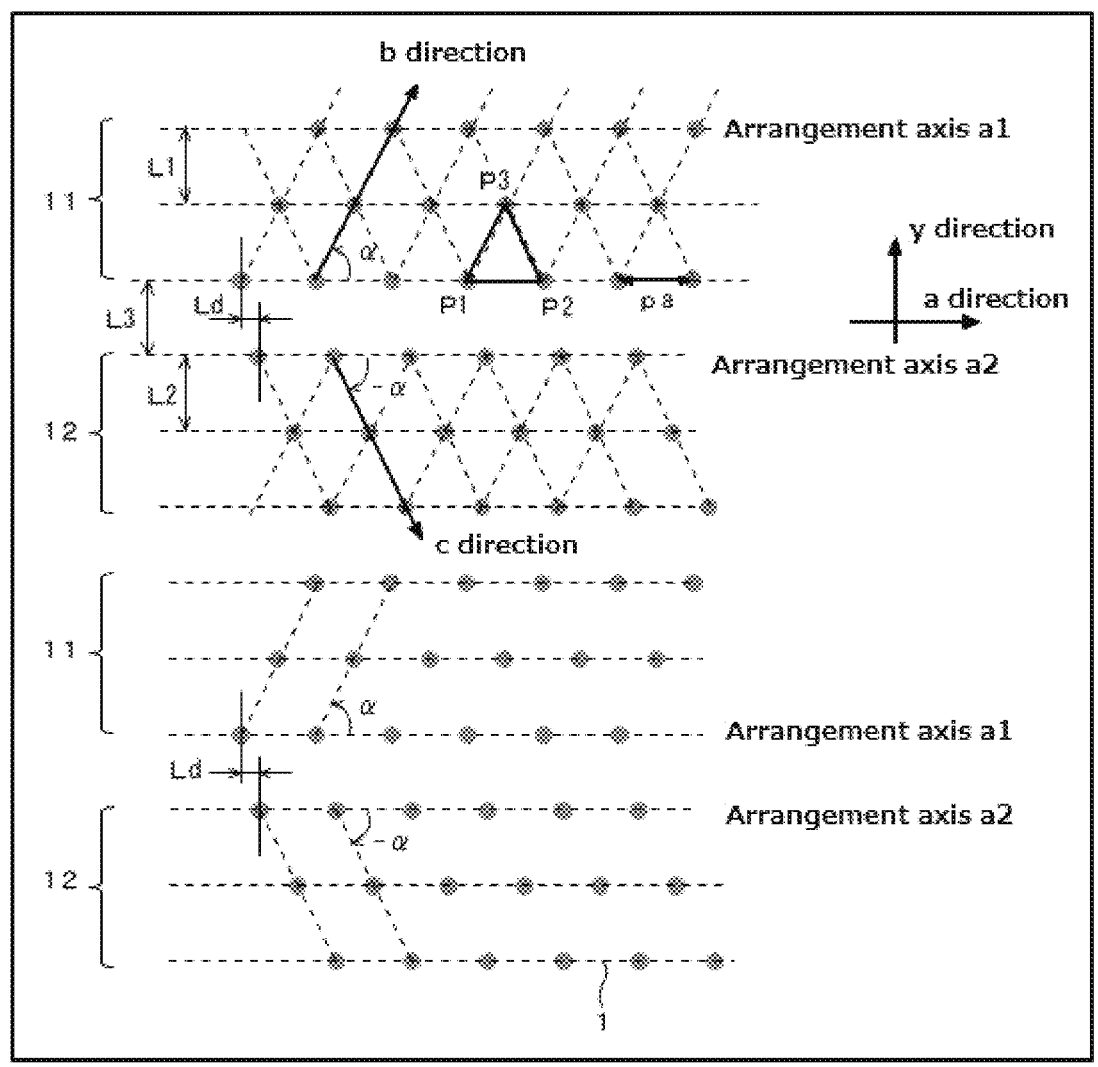
FIG. 1B is a plan view illustrating a disposition of conductive particles in an anisotropic conductive film of an example.

In contrast, as shown in FIG. 1B, when ∠P3P1P2=∠P3P2P1 is satisfied, the particle disposition of the first orthorhombic lattice region 11 itself is equal to the particle disposition of the second orthorhombic lattice region 12. Here, the distance between the first orthorhombic lattice region 11 and the second orthorhombic lattice region 12 is represented by L3;

the distance between adjacent arrangement axes a1 in the first orthorhombic lattice region 11 is represented by L1;

the distance between adjacent arrangement axes a2 in the second orthorhombic lattice region 12 is represented by L2;

the shift amount in the a direction between the positions of the conductive particles in the adjacent arrangement axes a1 and a2 of the first orthorhombic lattice region 11 and the second orthorhombic lattice region 12 respectively is represented by Ld; and the pitch of the arrangement axes a1 and a2 is represented by pa.

In this case, when L3=L1, L2 and Ld=(½)×pa are satisfied, the second orthorhombic lattice region 12 also includes the arrangement axis of which direction is the same as that of the arrangement axis in the b direction in the first orthorhombic lattice region 11, and the extension of the arrangement axis of the second orthorhombic lattice region serves as the arrangement axis in the b direction of the first orthorhombic lattice region. Thus for the arrangement axis inclined with respect to the a direction, when the arrangement axis of one orthorhombic lattice region of both the orthorhombic lattice regions 11 and 12 also serves as the arrangement axis of the other orthorhombic lattice region as it is, the arrangement axis intersecting the a direction does not extend in a zigzag fashion in the whole anisotropic conductive film, so that such particle disposition cannot provide the effects of the present invention. Thus, such particle dispositions are excluded from the present invention.

On the other hand, when ∠P3P1P2≠∠P3P2P1 is satisfied, even if L3=L1, L2 and Ld=(½)×pa are satisfied, the effects of the present invention can be obtained. For example, the present invention may take the following conditions: the average particle diameter of the conductive particles is 3.2 μm, the number of arrangement axes in the a direction in each of the first orthorhombic lattice region 11 and the second orthorhombic lattice region 12 is set to 2, L1=L2=L3=9.5 μm, pa=9 μm, Ld=(½)×pa=4.5 μm, the strain amount s=2.25 μm, α=76°, and the number density is 12000 particles/mm² (FIG. 1I).

Figure 1C:
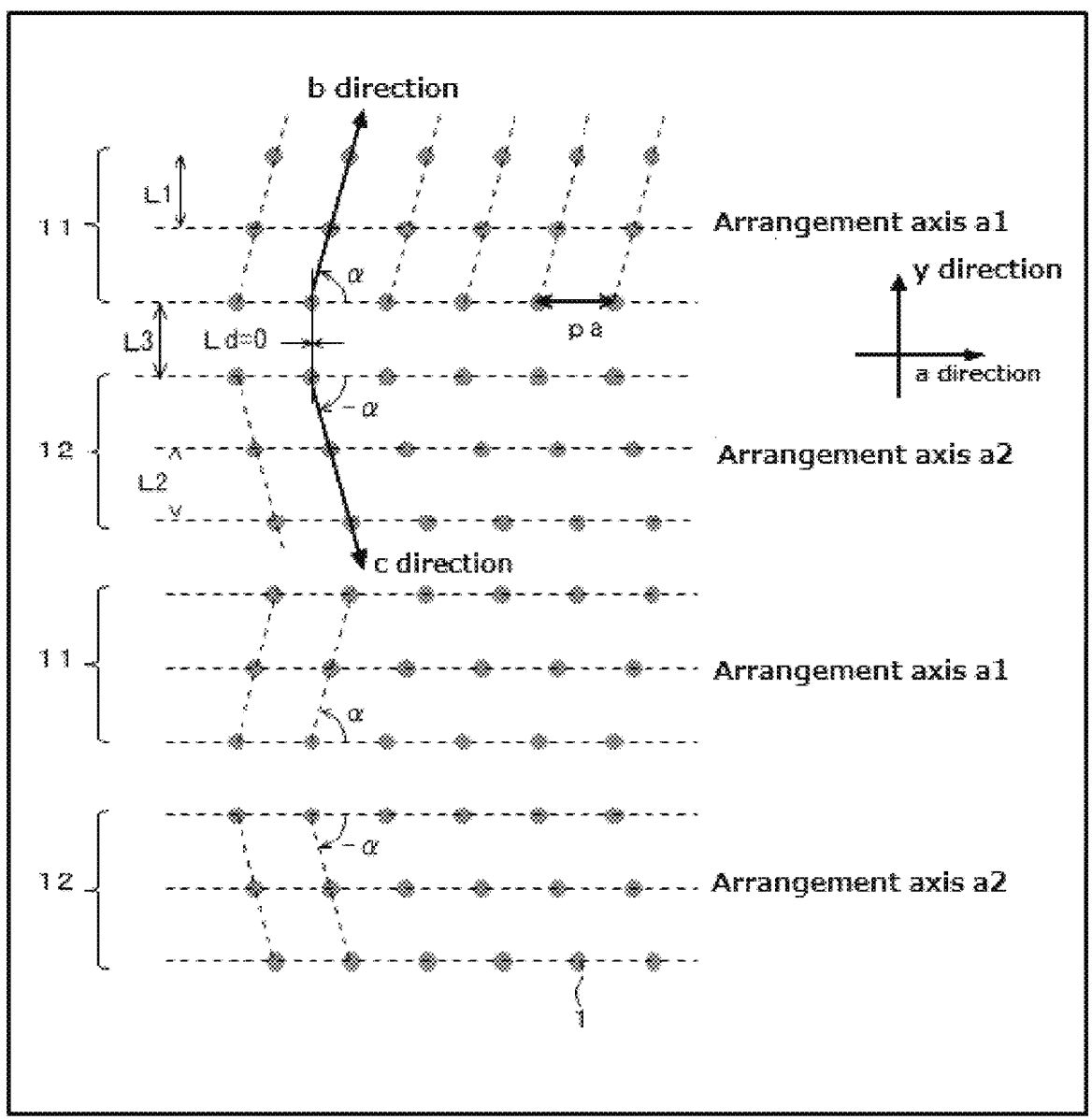
FIG. 1C is a plan view illustrating a disposition of conductive particles in an anisotropic conductive film of an example.
Figure 1D:
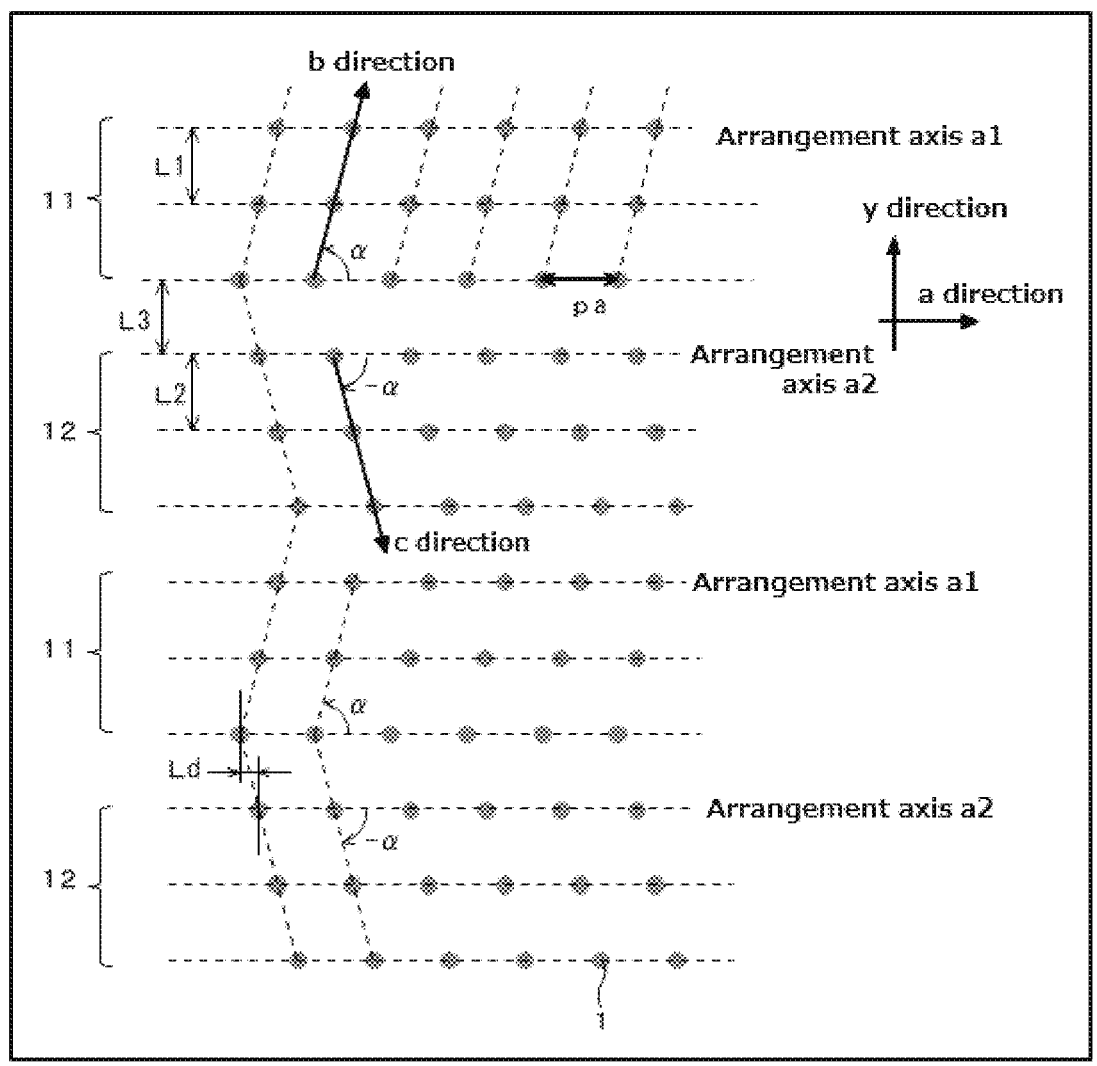
FIG. 1D is a plan view illustrating a disposition of conductive particles in an anisotropic conductive film of an example.
Figure 1E:
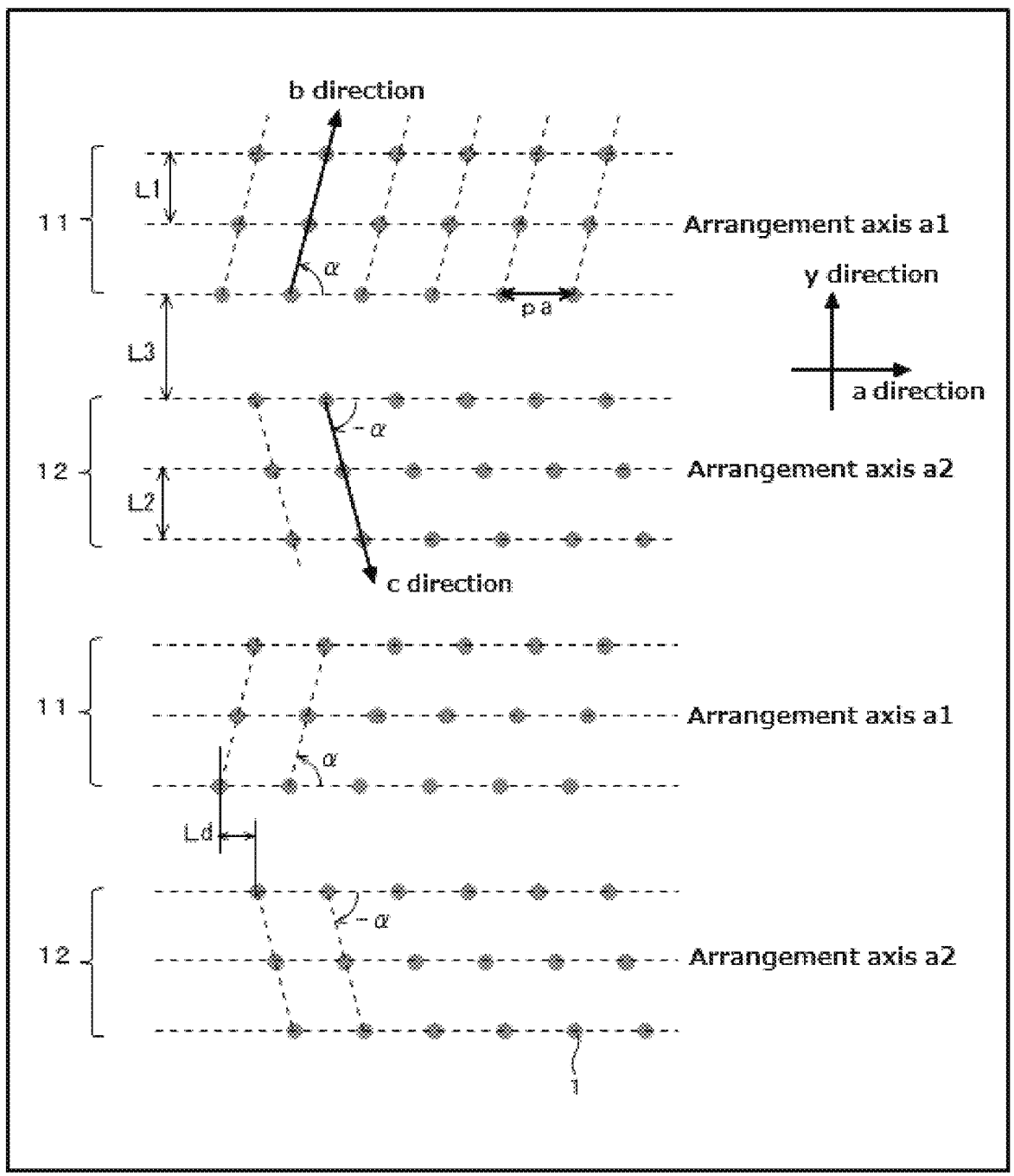
FIG. 1E is a plan view illustrating a disposition of conductive particles in an anisotropic conductive film of an example.
Figure 1F:
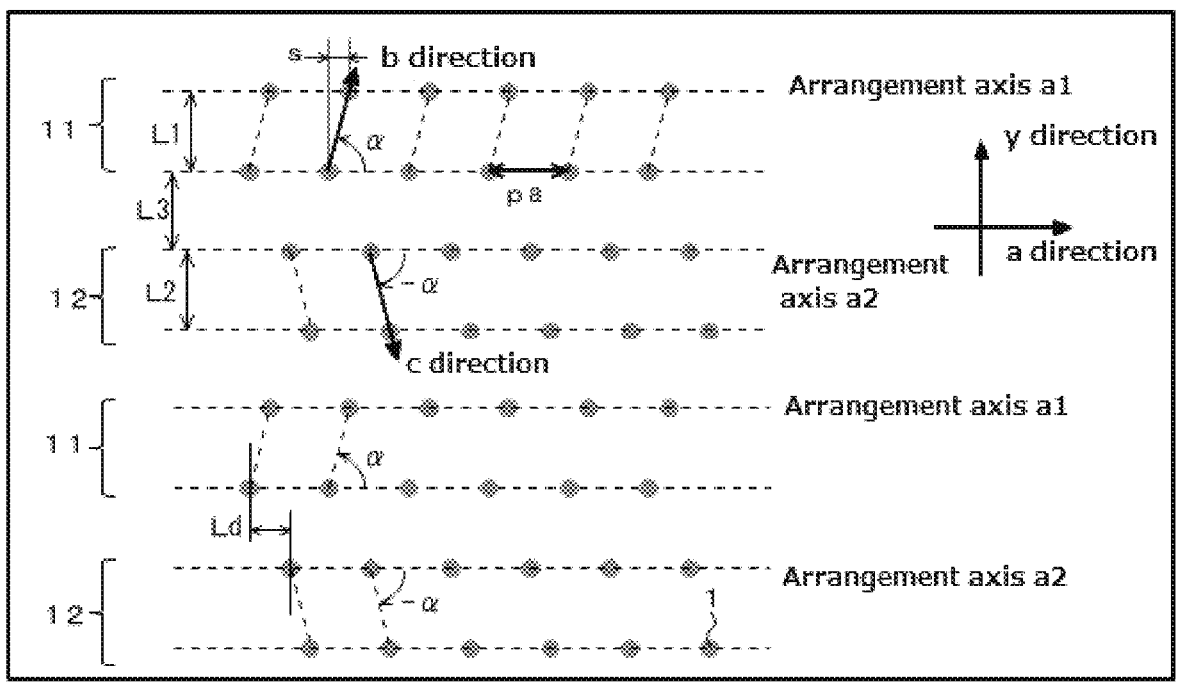
FIG. 1F is a plan view illustrating a disposition of conductive particles in an anisotropic conductive film of an example.
Figure 1G:
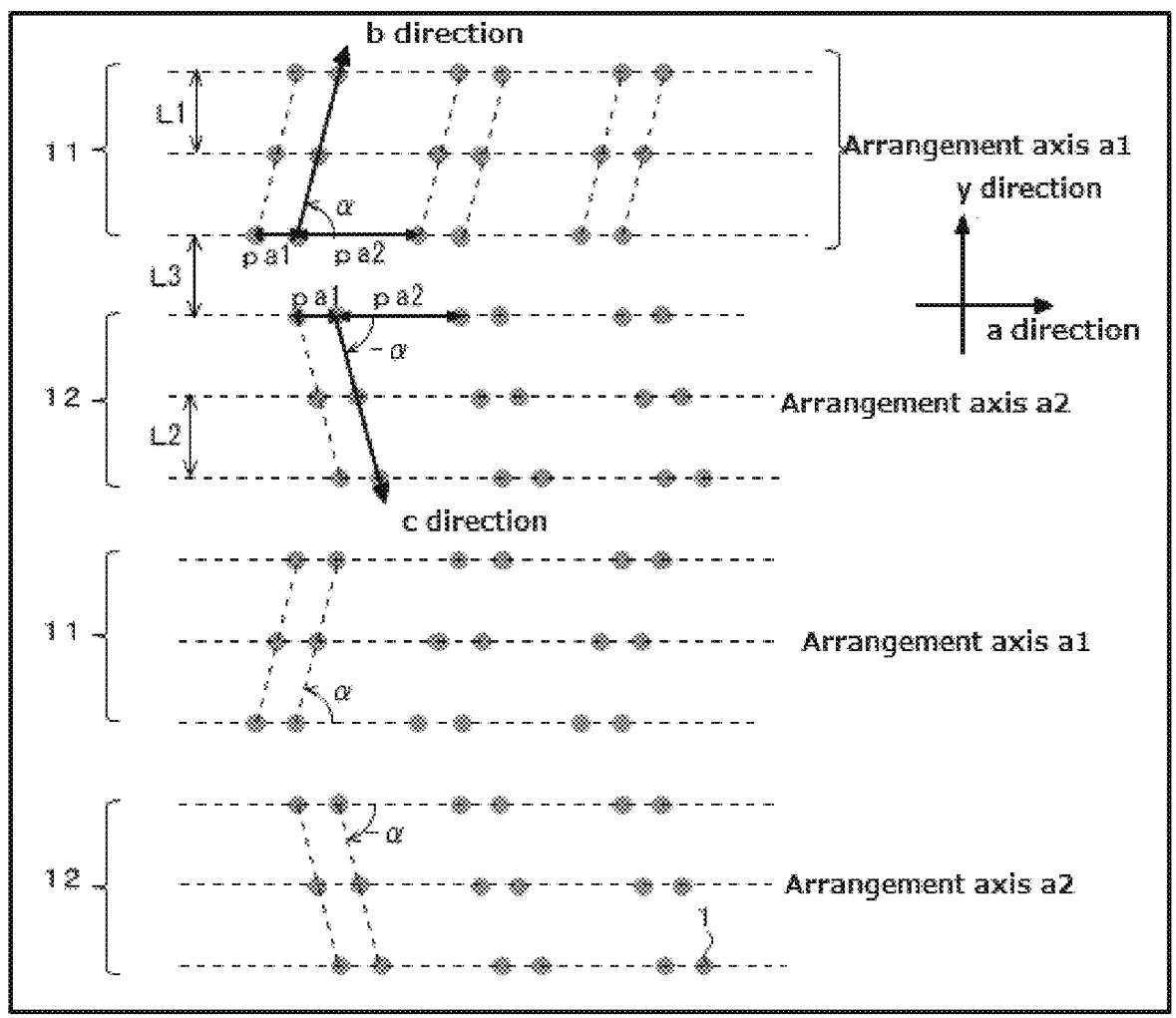
FIG. 1G is a plan view illustrating a disposition of conductive particles in an anisotropic conductive film of an example.
Figure 1H:
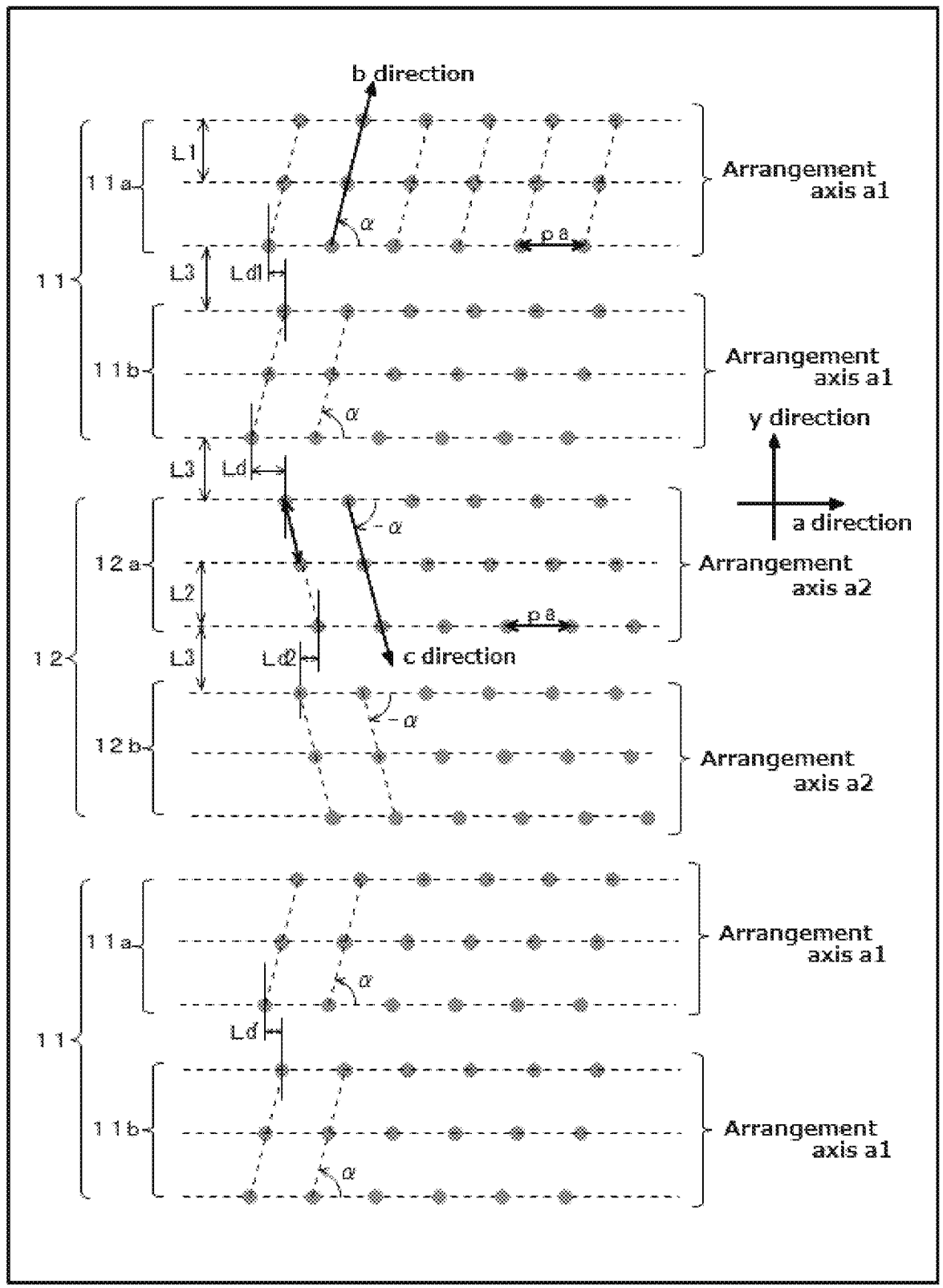
FIG. 1H is a plan view illustrating a disposition of conductive particles in an anisotropic conductive film of an example.
Figure 1I:
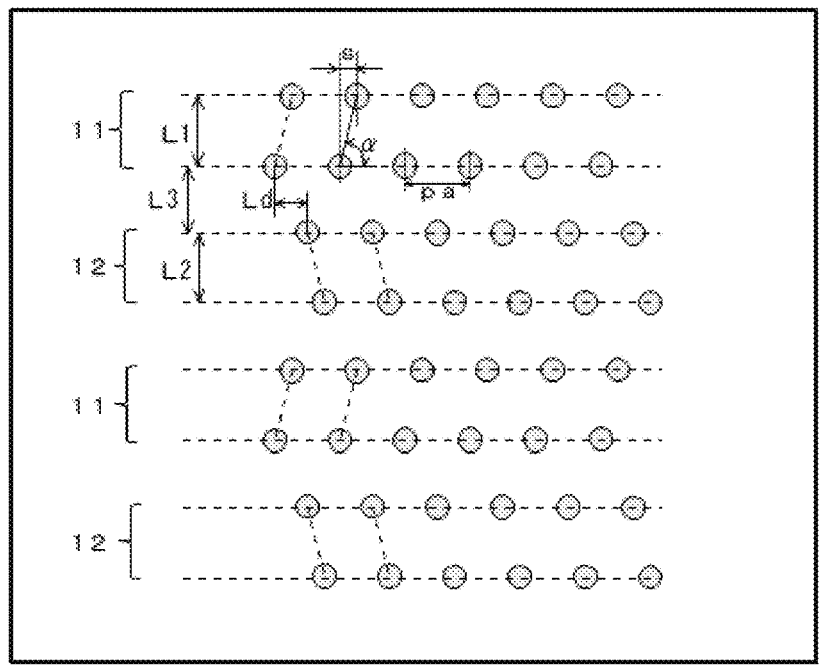
FIG. 1I is a plan view illustrating a disposition of conductive particles in an anisotropic conductive film of an example.
Figure 1J:
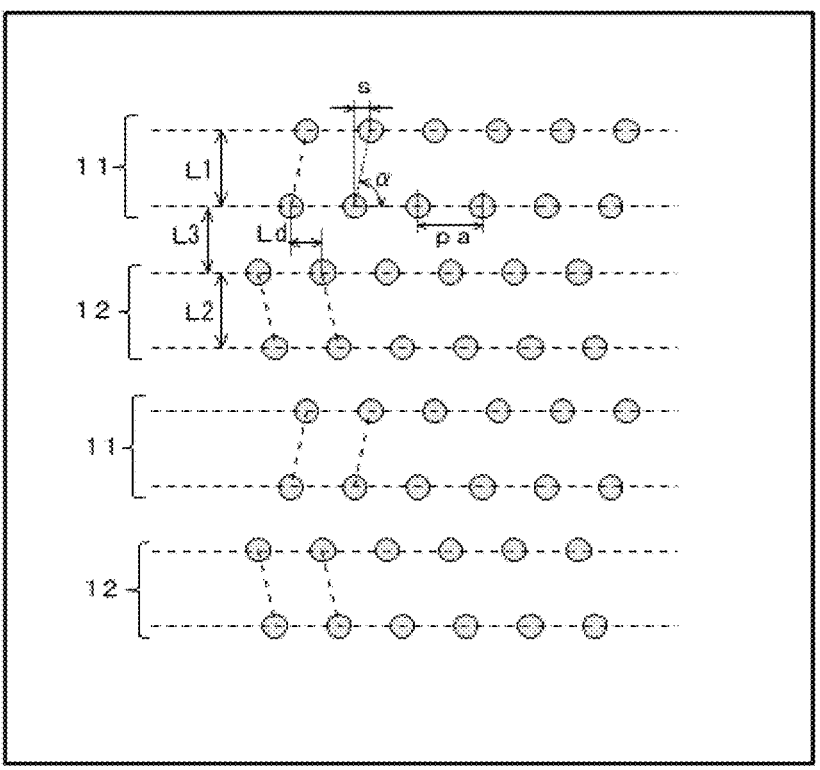
FIG. 1J is a plan view illustrating a disposition of conductive particles in an anisotropic conductive film of an example.

In addition, the present invention may also take the following conditions: conductive particles having the same average particle diameter are used, the number of arrangement axes in the a direction in each of the first orthorhombic lattice region 11 and the second orthorhombic lattice region 12 is set to 2, L1=L2=10.4 μm, L3=8.8 μm, pa=8.8 μm, Ld=(½)×pa=4.4 μm, the strain amount s=2.2 μm, α=78°, and the number density is 12000 particles/mm² (FIG. 1J).

Figure 1K:
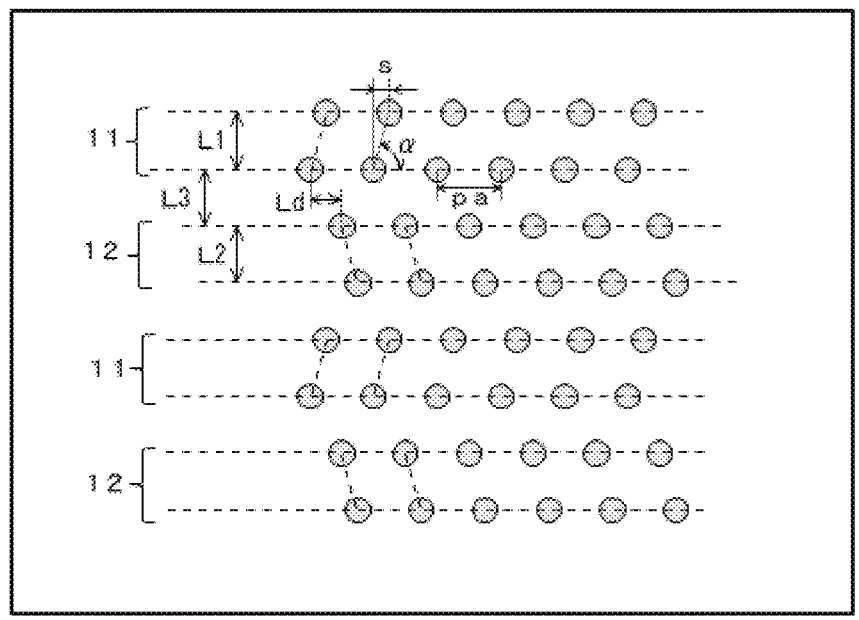
FIG. 1K is a plan view illustrating a disposition of conductive particles in an anisotropic conductive film of an example.

In addition, the present invention may also take the following conditions: conductive particles having the same average particle diameter are used, the number of arrangement axes in the a direction in each of the first orthorhombic lattice region 11 and the second orthorhombic lattice region 12 is set to 2, L1=L2=L3=7.5 μm, pa=8.4 μm, Ld=(½)×pa=4.2 μm, the strain amount s=2.1 μm, α=75°, and the number density is 16000 particles/mm² (FIG. 1K). In this manner, the pitch pa may be larger than L1, L2, and L3.

In the embodiments shown in FIG. 1I, FIG. 1J, and FIG. 1K, ½ of the pitch pa is set as the shift amount Ld, and ½ of the shift amount Ld is set as the strain amount s. This relationship among the pitch Pa, the shift amount Ld, and the strain amount s is preferable for the convenience of designing of the particle disposition. Further, it is easy to confirm the disposition state of the conductive particles after the anisotropic conductive film is produced. For example, by drawing an auxiliary line connecting the center points and the circumscribed line of the conductive particles in a photographed image of an anisotropic conductive film, it is possible to easily confirm the shift amount Ld and the strain amount s.

Further, as shown in FIG. 1B, when L3≠L1, L2 or Ld≠(½)×pa is satisfied even in the case of satisfying ∠P3P1P2=∠P3P2P1, the first orthorhombic lattice region 11 and the second orthorhombic lattice region 12 can be distinguished from each other as different regions. In the whole anisotropic conductive film, the arrangement axis intersecting the a direction extends in a zigzag fashion, so that the effects of the present invention can be obtained.

In the present invention, it is preferable that the shift amount Ld is not zero. This is because the inter-particle distance in the y-direction in the anisotropic conductive film is appropriately widened to prevent a short circuit from occurring due to the connected particles between the terminals at the time of connection while ensuring the proper number of captured particles at each terminal. That is, when the shift amount Ld is zero, the conductive particles of the first orthorhombic lattice region and the conductive particles of the second orthorhombic lattice region adjacent in the y direction are overlaid in the y direction. Therefore, if the distance L3 is short, the connection between the conductive particles due to the resin flow between the terminals at the time of connection is likely to occur. Therefore, the absolute value of the shift amount Ld is preferably more than 0, more preferably more than or equal to 0.5 times the average particle diameter, still more preferably more than or equal to 1 time the average particle diameter, and particularly preferably more than 1 time the average particle diameter. On the other hand, the upper limit of the shift amount Ld is preferably 0.5 times or less, more preferably less than 0.5 times, and still more preferably 0.3 times or less, the pitch pa of the arrangement axes a1 and a2.

The particle disposition shown in FIG. 1C is configured such that the shift amount Ld is 0 in the particle disposition shown in FIG. 1A. If the distance L3 is long with respect to the amount of movement of the conductive particles between the terminals at the time of connection, the shift amount Ld may be set to 0.

The particle disposition shown in FIG. 1D is configured such that, in the particle disposition shown in FIG. 1A, the shift amount Ld is adjusted to cross the arrangement axis in the b direction of the first orthorhombic lattice region 11 and the arrangement axis in the c direction of the second orthorhombic lattice region 12 on the conductive particles 1. By doing so, the axis of symmetry for the inversion of the b direction and the c direction is on the axis a1 or the axis a2, and the inverted shape is repeated in the y direction without a gap, so that designing of disposition of the conductive particles and the inspection process after the disposition may be facilitated. Thus, this configuration is preferable.

The particle disposition shown in FIG. 1E is configured such that the distance L3 between the first orthorhombic lattice region 11 and the second orthorhombic lattice region 12 in the particle disposition shown in FIG. 1A is varied from the distance L1 between the adjacent arrangement axes a1 in the first orthorhombic lattice region 11, or the distance L2 between the adjacent arrangement axes a2 in the second orthorhombic lattice region 12. These distances L1, L2, and L3 in the present invention are preferably set so as to satisfy L1=L2, or L1=L2=L3 from the viewpoints of convenience of designing the particle disposition and ease of comparison of the captured states of the conductive particles between terminals in the same terminal row. On the other hand, when the angle α, the pitch pa, repetition pitch of the first orthorhombic lattice region 11 and the second orthorhombic lattice region 12 or the like are adjusted so that the outermost terminals on the left and right sides in the fan-out arrangement obtain the same capturing state, L3≠L1, L2 may be satisfied in order to make it easier to compare the captured states after the connection in the inspection, or the like. In this case, L1≠L2 may be satisfied.

The distances L1 and L2 are preferably determined in accordance with the terminal layout, while their upper limit and lower limit are not specifically limited. If the distances are too small, the conductive particles are easily captured, but a short circuit is likely to occur; therefore, the distances as an example are preferably 1.4 times or more the average particle diameter D of the conductive particles.

The pitch pa of the conductive particles in the arrangement axis a1 of the first orthorhombic lattice region 11 and in the arrangement axis a2 of the second orthorhombic lattice region 12 is preferably determined in accordance with the terminal layout while the upper limit and lower limit thereof are not specifically limited. If the pitch is too small, a short circuit is likely to occur. Thus, the pitch as an example is preferably 1.5 times or more the average particle diameter D of the conductive particles, and in particular, is preferably equal to or more than a distance obtained by adding 0.5 μm to a value of two times the average particle diameter D. Thus, even when the conductive particles that have been held between the opposing terminals move to the inter-terminal space due to resin flow of thermocompression bonding during anisotropic conductive connection, the connection of the conductive particles 1 in the inter-terminal space is prevented, so that it is possible to further prevent a short circuit.

On the other hand, increasing the pitch pa can reduce the number of conductive particles required in the anisotropic conductive film. Further, even if the terminal width is narrow, the number of conductive particles captured per terminal satisfies a predetermined number when the terminal length is sufficiently long. Therefore, when the a direction is the same direction as the arrangement direction of the terminals, it is preferable that the pitch pa be ½ to ⅔ the minimum width of the effective connection region after the connection of the terminals of the electronic components to be connected through the anisotropic conductive film.

Further, the distances L1, L2, and L3 are equal to the pitch pa, i.e., the respective particle dispositions of the first orthorhombic lattice region 11 and the second orthorhombic lattice region 12 are an orthorhombic lattice obtained by distorting the square lattice in the a direction, and further, the distance L3 between the first orthorhombic lattice region 11 and the second orthorhombic lattice region 12 is also preferably equal to the lattice pitch. This is preferable in view of making the capturing state uniform over the whole surface.

The particle disposition shown in FIG. 1F is configured such that, in the particle disposition shown in FIG. 1A, the arrangement number n1 of the arrangement axes a1 in the first orthorhombic lattice region 11 and the arrangement number n2 of the arrangement axes a2 in the second orthorhombic lattice region 12 are set to 2. FIG. 1I, FIG. 1J, and FIG. 1K described above are further concrete embodiments thereof. In the present invention, it is preferable that the arrangement number n1 of the arrangement axes a1 in the first orthorhombic lattice region 11 and the arrangement number n2 of the arrangement axes a2 in the second orthorhombic lattice region 12 are equal to each other. However, the arrangement numbers n1 and n2 may be different from each other. Further, these arrangement numbers n1 and n2 can be determined in accordance with the terminal layout, and therefore, they are not particularly limited. For fine pitch components, the arrangement numbers n1 and n2 are each preferably 4 or less, more preferably 3 or less, and still more preferably 2, in order to achieve both capture of conductive particles and suppression of a short circuit. This is because, when the arrangement number n1 of the arrangement axes a1 in the first orthorhombic lattice region and the arrangement number n2 of the arrangement axes a2 in the second orthorhombic lattice region are set to 2 to 4, the pitch of the zigzag of the arrangement axes becomes finer compared with the case of having more arrangement number than that. Thus, the distribution states of the conductive particles in the right terminal and the left terminal can be made more uniform when the fan-out type terminal row is connected, and the conductive particles are less likely to be in contact with each other even when the conductive particles move due to the resin flow during anisotropic conductive connection.

The particle disposition shown in FIG. 1G is configured such that the pitch of the conductive particles in the a direction in the first orthorhombic lattice region 11 in the particle disposition shown in FIG. 1A is set such that, instead of the single pitch pa, different pitches pa1 and pa2 are alternately repeated. In this particle disposition, the pitch pa1 and the pitch pa2 of the conductive particles in the a direction are alternately repeated also in the second orthorhombic lattice region 12. As described above, in the present invention, the pitch of the conductive particles disposed in the a direction may be a regular pitch, and does not necessarily have to be a constant pitch.

The particle disposition shown in FIG. 1H is configured such that, in the particle disposition shown in FIG. 1A, two first orthorhombic lattice regions 11a and 11b, of which the arrangement axes in the b direction in the first orthorhombic lattice region 11 are each displaced in the a direction, are provided and two second orthorhombic lattice regions 12a and 12b, of which the arrangement axes in the c direction in the second orthorhombic lattice region 12 are each also displaced in the a direction, are provided. In this case, the shift amount Ld1 in the a direction between the adjacent arrangement axes a1 of the two first orthorhombic lattice regions 11a and 11b and the shift amount Ld2 in the a direction between the adjacent arrangement axes a2 of the two second orthorhombic lattice regions 12a and 12b may be the same or different.

In the present invention, it is sufficient that the first orthorhombic lattice region and the second orthorhombic lattice region are repeatedly arranged in the y direction, but they may not necessarily be alternately repeated. In this case, in the unit length of the y direction, it is preferable that the total number of repetitions in the y direction of the arrangement axes a1 of the first orthorhombic lattice region be equal to the total number of repetitions in the y direction of the arrangement axes a2 of the second orthorhombic lattice region.

Number Density

In any of the particle dispositions shown in FIG. 1A to FIG. 1K, the number density of the conductive particles in the anisotropic conductive film of the present invention can be determined in accordance with the shape, size, arrangement pitch, and the like of the terminals of electronic components to be connected. Typically, the number density of the conductive particles is not particularly limited because preferred conditions change depending on combinations and use applications of electronic components to be connected. The lower limit of the number density may be practically 30 particles/mm$^2$ or more, and preferably 150 particles/mm$^2$ or more. If the number of conductive particles is small, a cost reduction effect is expected. The upper limit of the number density is practically 70000 particles/mm$^2$ or less, more preferably 42000 particles/mm$^2$ or less. In particular, for fine-pitch applications, the number density is preferably in the range of 6000 to 35000 particles/mm$^2$. When the average particle diameter of the conductive particles is 10 μm or more, the number density is preferably set to fall within the range of 50 to 2000 particles/mm$^2$.

It should be noted that the number density of the conductive particles in the present invention is equal to the number density in the case where the angle α is set to 90° and the first orthorhombic lattice region 11 and the second orthorhombic lattice region 12 are set as a square lattice or a rectangular lattice rather than the orthorhombic lattice. Therefore, the pitch pa and the distances L1 and L2 can be determined by calculating the inter-lattice distance using the square lattice or the rectangular lattice.

As a measurement region for measuring the number density, it is preferable to arbitrarily set a plurality of rectangular regions having one side of 100 μm or more (preferably, 5 or more regions, more preferably, 10 or more regions) and set the total area of the measurement regions to be 2 mm$^2$ or more. The length of the sides and total area of the rectangular region may be adjusted in accordance with the average particle diameter. The size of individual measurement regions and the number thereof may be appropriately adjusted depending on the state of the number density. For example, several tens or more conductive particles may be present in one rectangular region. As a more specific example, for anisotropic conductive films having a relatively large number density of conductive particles for fine-pitch applications, the number density can be obtained by measuring number densities of 200 regions (2 mm) having an area of 100 μm×100 μm using images observed with a metallurgical microscope or the like, and averaging the measured number densities. The number density may be obtained by measuring an observation image using an image analysis software (for example, WinROOF manufactured by Mitani Corporation, A-Zo Kun manufactured by Asahi Kasei Engineering Co., Ltd., or the like). On the other hand, when the number density of the conductive particles is relatively small, the number density may be calculated using the pitch of the arrangement axes in the long-side direction of the film and the arrangement pitch of the arrangement axes in the film width direction on the basis of the prerequisite in which the conductive particles are regularly disposed. It should be noted that the length of the side of the rectangle and the number of measurement points are not limited to the numerical values described above.

Further, with respect to the number density of the conductive particles, the area occupancy rate of the conductive particles calculated by the following equation is preferably set to 0.3% or more from the viewpoint of lowering the conduction resistance. On the other hand, from the viewpoint of suppressing the thrust required for a pressing jig at the time of connection, the area occupancy rate is preferably 35% or less, and more preferably 30% or less.

Area occupancy rate of the conductive particles (%)=[number density of conductive particles in a plan view]×[average area of one conductive particle in a plan view]×100

Position of Conductive Particles in Film Thickness Direction

The positions of the conductive particles 1 in the film thickness direction are preferably aligned. For example, as illustrated in FIG. 2, it is possible to make the embedded amount Lb of the conductive particles 1 in the film thickness direction uniform. This facilitates stabilizing the property of capturing the conductive particles 1 at the terminal. On the other hand, in the present invention, the conductive particles 1 may be exposed from the insulating resin layer 2 or may be completely embedded therein.

Here, the embedded amount Lb refers to a distance between the surface of the insulating resin layer 2 in which the conductive particles 1 are embedded (of the front and back surfaces of the insulating resin layer 2, the surface on the side where the conductive particles 1 are exposed, or the surface close to the conductive particles 1 when the conductive particles 1 are completely embedded in the insulating resin layer 2), in particular, the tangential plane 2p in the center portion between the adjacent conductive particles, and the deepest portion of the conductive particles 1.

The embedded amount Lb can be obtained by observing the SEM image of a portion of the film cross section of the anisotropic conductive film. In this case, it is preferable to arbitrarily extract 10 or more regions having an area of 30 mm² or more from the anisotropic conductive film, and measure the embedded amounts of 50 or more conductive particles, more preferably 200 or more conductive particles and calculate the average of the embedded amounts.

Embedded Rate

When the ratio of the embedded amount Lb to the average particle diameter D of the conductive particles 1 is defined as the embedded rate (Lb/D), the embedded rate is preferably 30% or more and 105% or less. By setting the embedded rate (Lb/D) to 30% or more, the conductive particles 1 can be maintained in a predetermined position by the insulating resin layer 2. Further, by setting the embedded rate (Lb/D) to 105% or less, it is possible to reduce the amount of the resin of the insulating resin layer that acts to unnecessarily flow the conductive particles between the terminals during anisotropic conductive connection.

<Insulating Resin Layer>

In the present invention, the insulating resin layer 2 can be formed using a curable resin composition formed of a polymerizable compound and a polymerization initiator as in the case of the insulating resin layer of the anisotropic conductive film described in Japanese Patent No. 6187665. In this case, a thermal polymerization initiator may be used as the polymerization initiator, and a photopolymerization initiator may be used. They may be used in combination. For example, a cationic polymerization initiator is used as a thermal polymerization initiator, an epoxy resin is used as a thermo-polymerizable compound, a photoradical polymerization initiator is used as a photopolymerization initiator, and an acrylate compound is used as a photopolymerizable compound. As a thermal polymerization initiator, a thermal anionic polymerization initiator may be used. As the thermal anionic polymerization initiator, a microcapsule-type latent curing agent including an imidazole modified compound as a nucleus and a surface thereof coated with polyurethane is preferably used.

<Minimum Melt Viscosity of Insulating Resin Layer>

The minimum melt viscosity of the insulating resin layer 2 is not particularly limited, but may be 1000 Pa·s or more, and may be set to the same minimum melt viscosity as that of the insulating resin layer of the anisotropic conductive film described in Japanese Patent No. 6187665. The minimum melt viscosity thereof is preferably 1500 Pa·s or more, more preferably 2000 Pa·s or more, still more preferably 3000 to 15000 Pa·s, and particularly preferably 3000 to 10000 Pa·s. The minimum melt viscosity can be obtained by using, for example, a rotary rheometer (manufactured by TA Instruments), and maintaining a constant measurement pressure of 5 g with the use of a measurement plate of a diameter of 8 mm. More specifically, it can be obtained by setting the rate of temperature increase to 10° C./min, the measurement frequency to 10 Hz, and the load variation to 5 g with respect to the measurement plate in a temperature range of 30 to 200° C. The minimum melt viscosity can be adjusted by changing the type and the added amount of a fine solid to be contained as the melt viscosity modifier, the adjustment condition of the resin composition, and the like.

<Low Viscosity Resin Layer>

The low viscosity resin layer 3 is a resin layer having a minimum melt viscosity in a range of 30 to 200° C. lower than that of the insulating resin layer 2. In the present invention, the low viscosity resin layer 3 is provided as necessary. When the low viscosity resin layer 3 is laminated on the insulating resin layer 2 and thermocompression bonding of the electronic components facing each other is performed through the anisotropic conductive film 10A, a space formed by electrodes and bumps of the electronic components is filled with the low viscosity resin layer 3, so that the adhesion property between the electronic components can be improved.

Further, as there is a difference between the minimum melt viscosity of the insulating resin layer 2 and the minimum melt viscosity of the low viscosity resin layer 3, the space between the electronic components to be connected through the anisotropic conductive film 10A is filled with the low viscosity resin layer 3, so that the adhesion property between the electronic components is easily improved. Further, as the difference is greater, the movement amount of the insulating resin layer 2 holding the conductive particles 1 at the time of thermocompression bonding is relatively smaller than that of the low viscosity resin layer 3. Therefore, the property of capturing the conductive particles 1 by the terminals is easily improved.

Although depending on the ratio of the layer thicknesses of the insulating resin layer 2 and the low viscosity resin layer 3, the minimum melt viscosity ratio of the insulating resin layer 2 and the low viscosity resin layer 3 is preferably 2 or more, more preferably 5 or more, and still more preferably 8 or more. On the other hand, if the ratio is too large, the resin may be protruded or blocking may occur when a long anisotropic conductive film is formed into a wound body. Therefore, the minimum melt viscosity ratio is preferably 15 or less in practical use. More specifically, the preferable minimum melt viscosity of the low viscosity resin layer 3 satisfies the minimum melt viscosity ratio of the insulating resin layers described above, and is preferably 3000 Pa·s or less, more preferably 2000 Pa·s or less, and still more preferably 100 to 2000 Pa·s.

The low viscosity resin layer 3 can be formed by adjusting the viscosity of the resin composition similar to that of the insulating resin layer 2.

<Layer Thicknesses of Insulating Resin Layer and Low Viscosity Resin Layer>

In order to stably push the conductive particles 1 into the insulating resin layer 2 in the producing process of the anisotropic conductive film described later, the layer thickness of the insulating resin layer 2 is preferably 0.3 times or more, more preferably 0.6 times or more, further preferably 0.8 times or more, and particularly preferably 1 time or more, the average particle diameter D of the conductive particles 1. The upper limit of the layer thickness of the insulating resin layer 2 can be determined in accordance with the terminal shape, the terminal thickness, the arrangement pitch or the like of the electronic component to be connected. However, if the layer thickness is too thick, the conductive particles 1 at the time of connection are unnecessarily affected by the resin flow. Therefore, the layer thickness of the insulating resin layer 2 is preferably 20 times or less, more preferably 15 times or less, the average particle diameter D of the conductive particles 1.

The low viscosity resin layer 3 is provided as necessary in the present invention. When the low viscosity resin layer is provided, the lower limit of the layer thickness thereof is preferably 0.2 times or more, more preferably 1 time or more, the average particle diameter D of the conductive particles 1. Further, if the layer thickness of the low viscosity resin layer 3 becomes too thick, the difficulty of lamination with the insulating resin layer 2 increases. From this, the upper limit of the layer thickness of the low viscosity resin layer 3 is preferably 50 times or less, more preferably 15 times or less, and still more preferably 8 times or less, the average particle diameter D of the conductive particles 1.

Further, from the viewpoints of suppressing the unnecessary flow of the conductive particles 1 at the time of connection of the electronic component, suppressing the protrusion or blocking of the resin when the anisotropic conductive film is formed into a wound body, lengthening the film length per unit weight of the anisotropic conductive film, and the like, the total thickness of the insulating resin layer 2 and the low-viscosity resin layer 3 is preferably thin. However, when the total thickness is too thin, the handleability of the anisotropic conductive film deteriorates. Further, it becomes difficult to attach the anisotropic conductive film to the electronic component when the total thickness is too thin. For this reason, a necessary adhesive force may not be obtained in the temporary pressure bonding when the electronic components are connected, and a necessary adhesive force may not be obtained even in the final pressure bonding due to the insufficiency of the resin amount. Therefore, the total thickness is preferably 0.6 times or more, more preferably 0.8 times or more, still more preferably 1 time or more, and particularly preferably 1.2 times or more, the average particle diameter D of the conductive particles 1.

The ratio between the thickness of the insulating resin layer 2 and the thickness of the low viscosity resin layer 3 can be appropriately adjusted in accordance with the combination of electronic components used for connection, the performance required therefor, and the like. These layer thicknesses can be measured by a commercially available digital thickness gauge or the like. The resolution of the digital thickness gauge is preferably 0.1 μm or less.

<Wound Body of Anisotropic Conductive Film>

The anisotropic conductive film of the present invention can be formed as a wound body in its product form. Although there is no particular limitation on the length of the wound body, it is preferably 5000 m or less, more preferably 1000 m or less, and still more preferably 500 m or less, from the viewpoint of handleability of the shipment. On the other hand, from the viewpoint of mass-productivity of the wound body, the length of the wound body is preferably 5 m or more. The film width is not particularly limited, but it is required to be narrow from the viewpoint of miniaturization of the mounting body. On the other hand, from the viewpoints of use methods such as of collectively connecting a plurality of parts by anisotropic conductive connection, or cutting a certain large sized part after collectively connecting it by anisotropic conductive connection, it is required that the area thereof be large. For this reason, there is also a demand for anisotropic conductive films having a wide width.

<Producing Method of Anisotropic Conductive Film>

The method of producing the anisotropic conductive film of the present invention itself is not particularly limited. For example, the anisotropic conductive film is produced by producing a transfer mold for disposing conductive particles in a predetermined arrangement, filling concave portions of the transfer mold with conductive particles, and covering the transfer mold with an insulating resin layer, which is formed on a release film, applying a pressure thereon to push and transfer the conductive particles into the insulating resin layer, or further laminating a low-viscosity resin layer on the conductive particles or on a surface opposite to the surface on which the conductive particles have been transferred.

Further, the anisotropic conductive film may be produced by, after filling the concave portions of the transfer mold with the conductive particles, covering the transfer mold with the insulating resin layer, transferring the conductive particles from the transfer mold to the surface of the insulating resin layer without pushing the conductive particles into the insulating resin layer in the transfer mold, and pushing the conductive particles disposed on the insulating resin layer into the insulating resin layer after transfer.

As the transfer mold, in addition to those having concave portions in which the conductive particles are filled, those having convex portions at the top surfaces of which a slightly adhesive agent is applied and in which the conductive particles are attached to the top surfaces may be used. These transfer molds can be produced using known techniques such as machining, photolithography, printing, or the like.

Examples of a method of disposing the conductive particles in a predetermined arrangement in place of the method of using a transfer mold may include a method of passing the conductive particles through through-holes provided in a predetermined disposition, a method of directly spraying the conductive particles on the film, and a method of stretching a film in which the conductive particles are densely disposed, or the like may be used.

<Method of Connecting Electronic Components Using Anisotropic Conductive Film>

As a method of connecting the electronic components using the anisotropic conductive film of the present invention, for example, one of the electronic components is placed on a stage, the other electronic component is placed thereon through the anisotropic conductive film, and heat pressing is performed with a pressure bonding tool, thereby connecting terminals of both electronic components by anisotropic conductive connection to produce a connection structure. In this case, the electronic component to be mounted on the stage is the second electronic component such as an IC chip, an IC module, an FPC, a glass substrate, a plastic substrate, a rigid substrate, or a ceramic substrate. The electronic component to be heated and pressurized by the pressure bonding tool is the first electronic component such as an FPC, an IC chip, or an IC module. As a more detailed method, the anisotropic conductive film is temporarily attached and pressure bonded to the second electronic component such as a substrate of any type, and the first electronic component such as an IC chip is attached and thermally pressure bonded to the temporarily pressure bonded anisotropic conductive film, to produce a connection structure by anisotropic conductive connection. The connection structure may be produced by temporarily attaching the anisotropic conductive film to the first electronic component, instead of attaching it to the second electronic component. The connection method is not limited to the thermocompression bonding, but may include pressure bonding using photocuring and pressure bonding using both heat and light.

The anisotropic conductive film of the present invention is of great significance when at least one of the first electronic component and the second electronic component is made of a material which is likely to be thermally expanded such as an FPC or a plastic substrate. When the terminal row is of a fan-out type, the anisotropic conductive film of the present invention is particularly effective. Further, even when the terminal row in which the long-side direction of the terminal is not inclined with respect to the arrangement direction of the terminals is connected, even when the parts having the arrangement direction of the terminal different in each side of the part like the terminals of a peripheral disposition are connected, and further even when the terminal shape is rectangular or circular, the conductive particles are uniformly disposed with respect to each terminal. Thus, the anisotropic conductive film of the present invention reliably connects them, and it is possible to suppress the occurrence of a short circuit. Furthermore, the dents inspection is also facilitated. Therefore, the anisotropic conductive film of the present invention can be versatility used regardless of the shape and disposition of the terminal row to be connected. This can eliminate the man-hours of preparing and using anisotropic conductive films with different dispositions and different number densities of the conductive particles for respective objects to be connected, so that it is possible to increase the economic merit by this reduction in man-hours. Accordingly, the present invention encompasses: a method of producing a connection structure for connecting terminals of a first electronic component and terminals of a second electronic component using the anisotropic conductive film of the present invention by anisotropic conductive connection; and a connection structure in which the first electronic component and the second electronic component are connected through the anisotropic conductive film of the present invention by anisotropic conductive connection.

The particle disposition of the anisotropic conductive film of the present invention can also be applied to those using various fillers in place of the conductive particles. As the filler in this case, for example, those described in Japanese Patent Application Laid-Open No. 2019-033060, Japanese Patent Application Laid-Open No. 2018-090768, and the like can be used. Therefore, the present invention can be applied to a filler-containing film (that is, a filler disposed film) in which the fillers described above are disposed in accordance with the particle disposition of the present invention, a method of connecting a first article and a second article using the filler-containing film, a method of producing a connection structure of the first article and the second article, a connection structure obtained thereby, and the like. Further, the present invention can be applied to a connection body in which the filler-containing film is attached only to the first article, a method of producing the same, and the like.

EXAMPLE

Hereinafter, the present invention will be described in detail with reference to Examples.

Examples 1 to 5

In the fan-out type terminal row A or B of each of specifications in Table 1, the following evaluation items (a) to (d) in the case of connecting the anisotropic conductive film with the particle disposition of each of Experimental Examples 1 to 5 shown in Table 2 were measured by simulation for evaluation. Among these, Experimental Examples 1 to 3 are examples of the present invention. Evaluation results are shown in Table 2. In relation to the evaluation results of (d), the simulation results of states of capturing the conductive particles in the terminal row B (the enlargement ratio of the inter-particle distances on a terminal and between terminals is also the same as in Table 1) when the number density was 16000 particles/mm$^2$ in the disposition of the conductive particles in each of Experimental Examples 1, 3, 4, and 5 are shown in FIGS. 7A to 7D.

In this simulation, the x-direction which is the arrangement direction of the terminals and the a direction of the anisotropic conductive film were set to be the same direction. The ratio between the inter-particle distance after pressure-bonding and the inter-particle distance before pressure-bonding in the x or y direction on the terminal, and the ratio between the inter-particle distance after pressure-bonding and the inter-particle distance before pressure-bonding in the x or y direction between the terminals were average values obtained by actually measuring the corresponding ratios of the anisotropic conductive film multiple times in advance in the same terminal row.

(a) Minimum Number of Captured Conductive Particles at Individual Terminals (Simulation in Terminal Row A)
  OK: 5 particles or more
  NG: 4 particles or less
  It should be noted that since this evaluation criterion is based on the simulation, a stricter evaluation criterion is adopted.

(b) Number of Conductive Particles Connected in the Long-Side Direction of the Terminal Between the Terminals (Simulation in Terminal Row B)
  OK: 3 particles or less
  NG: 4 particles or more (c) Number of Conductive Particles Linearly Arranged on the Terminal (Simulation in Terminal Row B)
  OK: 3 particles or less
  NG: 4 particles or more (d) Left-Right Uniformity of Property of Capturing Conductive Particles on the Right and Left Sides of the Terminal Arrangement (Simulation in Terminal Row B)
  Uniform: a case where the distribution patterns of the conductive particles captured by the terminals at a left-right symmetrical distance in the terminal arrangement are observed to be identical.
  Non-uniform: a case where the distribution patterns of the conductive particles captured by the terminals at a left-right symmetrical distance in the terminal arrangement are not observed to be identical.

TABLE 1

Specification of Fan-Out Type Terminal Row

|  | Terminal Row A | Terminal Row B |
|---|---|---|
| Terminal Length | 400 μm | 400 μm |
| Terminal Width | 4 μm | 8 μm |
| Terminal Pitch (*5) | 20 μm | 20 μm |
| Fan-Out Angle | −9° to 9° | −9° to 9° |
| Number of Terminals | 19 | 19 |
| Enlargement Ratio of Inter-particle Distance on Terminal (x direction) (*1) | 1.7 times | 1.7 times |
| Enlargement Ratio of Inter-particle Distance on Terminal (y direction) (*2) | 1.1 times | 1.1 times |
| Enlargement Ratio of Inter-particle Distance between Terminals (x direction) (*3) |  | 1 time |
| Enlargement Ratio of Inter-particle Distance between Terminals (y direction) (*4) |  | 1 time |

Note:
x direction: arrangement direction of terminals
y direction: direction perpendicular to x direction
(*1) Ratio of Inter-particle Distance after and before Compression Bonding in x Directionon Terminal
(*2) Ratio of Inter-particle Distance after and before Compression Bonding in y Directionon Terminal
(*3) Ratio of Inter-particle Distance after and before Compression Bonding in x Direction between Terminals
(*4) Ratio of Inter-particle Distance after and before Compression Bonding in y Direction between Terminals
(*5) Terminal Pitch on the Base End Side of Radial Arrangement (Narrowest Terminal Pitch)

TABLE 2

Figure 11A:
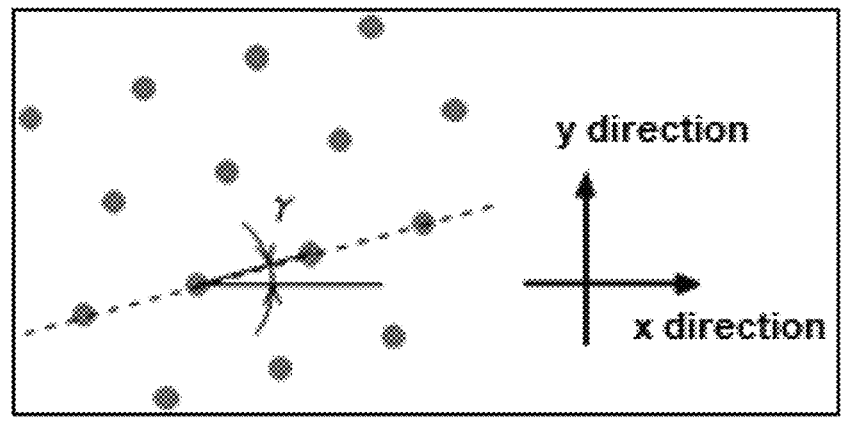
FIG. 11A shows the particle disposition of Experimental Example 4.
Figure 11B:
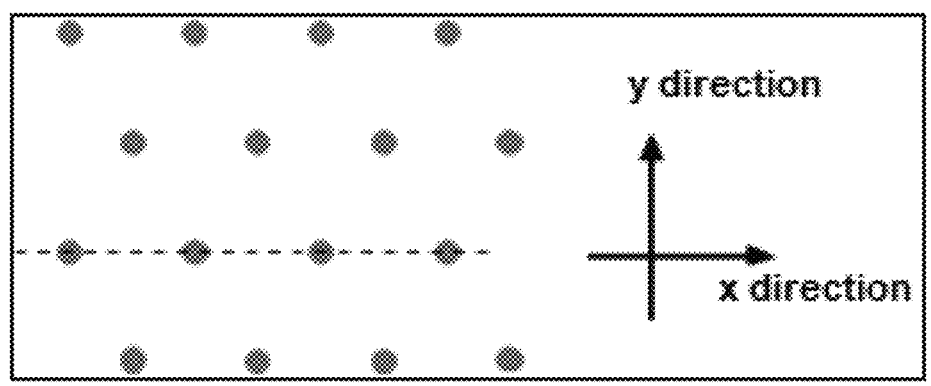
FIG. 11B shows the particle disposition of Experimental Example 5.

| Particle Disposition | Example | | | Comparative Example | |
|---|---|---|---|---|---|
| | Experimental Example 1 FIG. 1F | Experimental Example 2 FIG. 1F | Experimental Example 3 FIG. 1A | Experimental Example 4 FIG. 11A (*1) | Experimental Example 5 FIG. 11B (*2) |
| Number of Arrangement Axes a1 | 2 | 2 | 3 | | |
| Number of Arrangement Axes a2 | 2 | 2 | 3 | | |
| Pitch pa (µm) | 9.00 | 8.80 | 9.00 | | |
| Strain Amount s (µm) | 2.25 | 4.40 | 2.00 | | |
| Shift Amount Ld (µm) | 4.50 | 2.20 | 4.50 | | |
| Distance L1 (µm) | 9.50 | 8.80 | 9.45 | | |
| Distance L2 (µm) | 9.50 | 8.80 | 9.45 | | |
| Distance L3 (µm) | 9.50 | 10.40 | 9.45 | | |
| Particle Density (particles/mm²) | 12000 | 12000 | 12000 | 12000 | 12000 |
| Evaluation Result | | | | | |
| (a) Minimum Number of Captured Particles (*3) | 5 | 6 | 5 | 0 | 0 |
| (b) Number of Conductive Particles Connected Between Terminals (*4) | 3 | 2 | 2 | 4 | — |
| (c) Number of Linearly Arranged Conductive Particles on Terminal (*4) | 3 | 2 | 2 | 4 | — |
| (d) Uniformity on Left and Right (*4) | Uniform | Uniform | Uniform | Nonuniform | Uniform |

(*1) Hexagonal Lattice Inter-particle Distance 9.8 µm, Inclination Angle γ = 15°
(*2) Hexagonal Lattice Inter-particle Distance 9.8 µm, Inclination Angle γ = 0°
(*3) Simulation for Terminal Row A
(*4) Simulation for Terminal Row B From Table 2, evaluation items were favorable for Experimental Examples 1 to 3, and it can be seen that the number of captured particles are sufficiently ensured at each terminal, the number of particles continuously connected in the y direction between the terminals and the number of particles arranged on the terminals are reduced, and the uniformity on the left and right sides in the fan-out arrangement is good.

In contrast, it can be seen that, in Experimental Example 4, a short circuit is likely to occur because of the large number of particles arranged on the terminal and continuously connected in the y direction between the terminals, and the uniformity on the left and right sides is also inferior. Further, it can be seen that, in Experimental Example 5, the uniformity on the left and right sides is good, but the number of captured particles by the terminal is insufficient. It can also be seen from the simulation results shown in FIG. 7A to FIG. 7D that the uniformity of capturing the particles in the terminal row is improved in accordance with the particle disposition of Experimental Examples corresponding to the examples of the present invention.

Experimental Examples 6 to 9

(Production of Anisotropic Conductive Film)

A resin composition for forming an insulating resin layer and a resin composition for forming a low viscosity resin layer were prepared in a compounding ratio shown in Table 3, and anisotropic conductive films of Experimental Examples 6 to 9 were produced in the same manner as that in Example 3 of Japanese Patent No. 6187665 using these resin compositions. In this case, the layer thickness of the insulating resin layer was set to 4 µm, and the layer thickness of the low viscosity resin layer was set to 14 µm. As the conductive particles, metal-coated resin particles (Sekisui Chemical Co., Ltd., AUL703, average particle diameter of 3 µm) were used.

The planar disposition of the conductive particles was as follows:

Experimental Example 6: The disposition shown in FIG. 1K (L1=L2=L3: 7.5 µm, pitch pa: 8.4 µm, strain amount s: 2.1 µm, angle α: 75°, number density of particles: 16000 particles/mm²).

Experimental Example 7: The disposition shown in FIG. 1A (L1=L2=L3: 7.4 µm, pitches pa: 8.6 µm, strain amount s: 1.8 µm, angle α: 76°, number density of particles: 16000 particles/mm²).

Figure 5A:
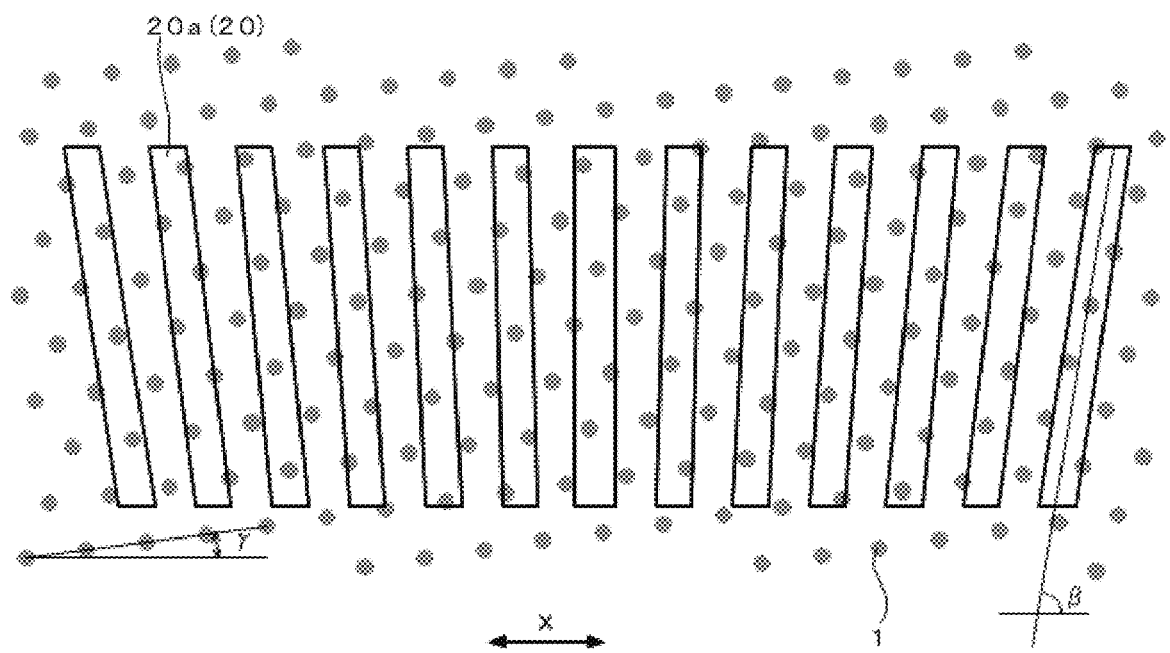
FIG. 5A is a plan view in which an anisotropic conductive film in which conductive particles are disposed in a hexagonal lattice (inclination angle γ) is overlaid on a terminal row of a fan-out type.
Figure 5B:
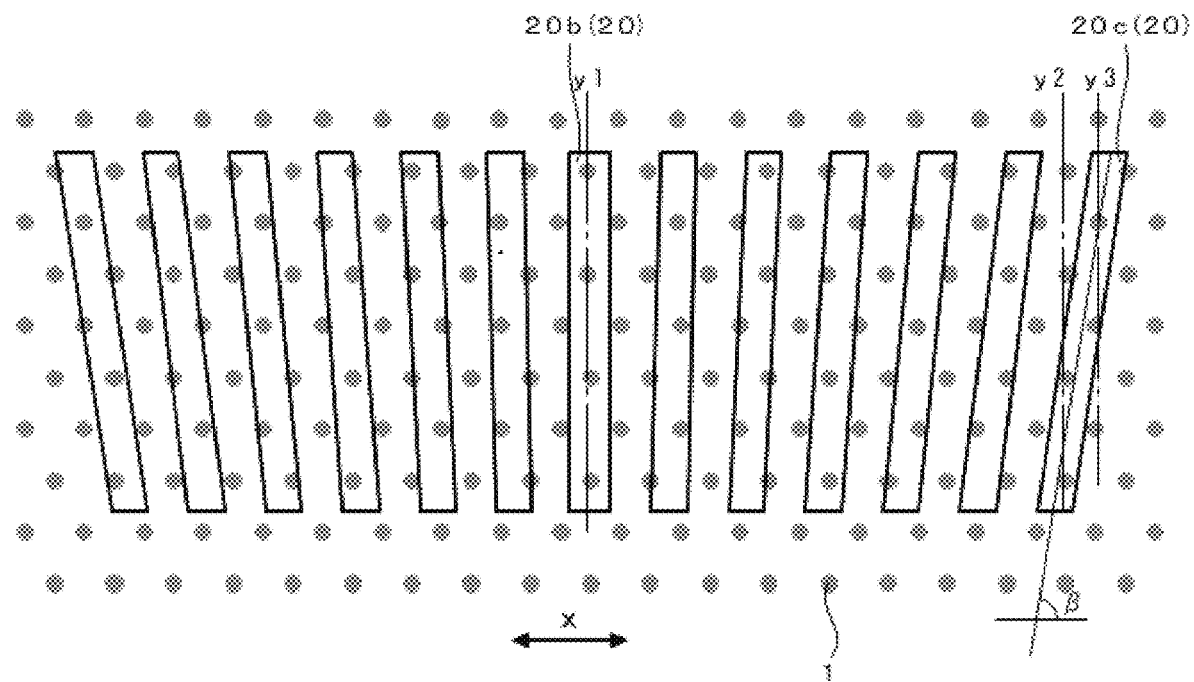
FIG. 5B is a plan view in which an anisotropic conductive film in which conductive particles are disposed in a hexagonal lattice (inclination angle γ=0°) is overlaid on a terminal row of a fan-out type.
Figure 5C:
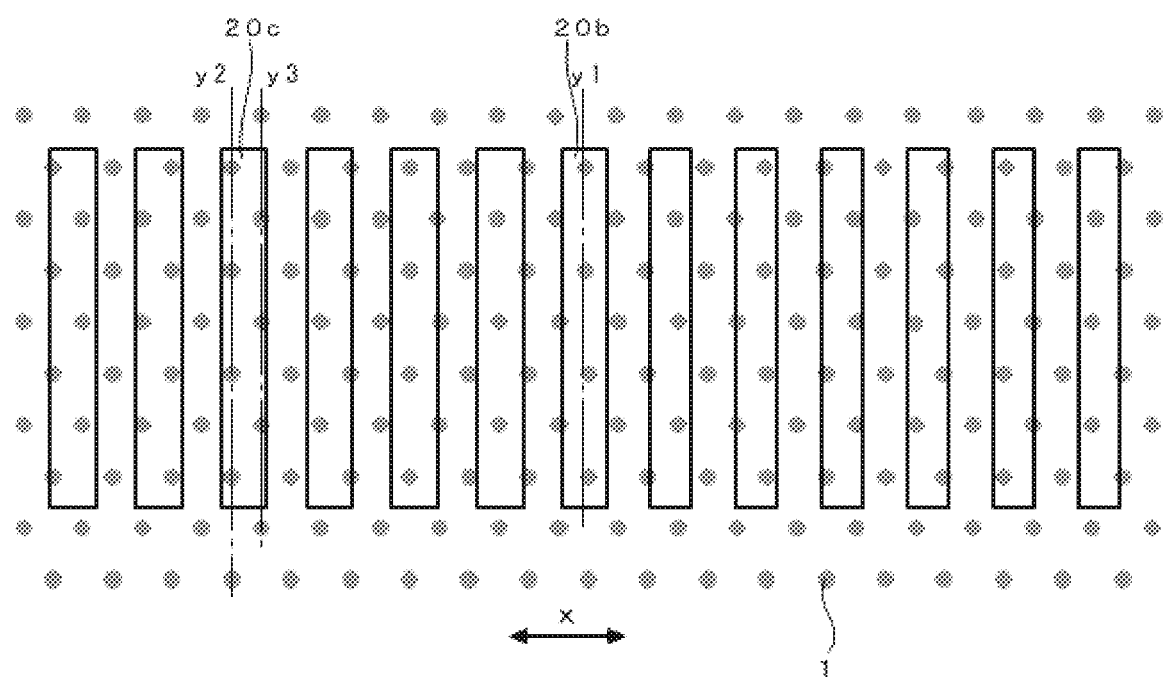
FIG. 5C is a plan view in which an anisotropic conductive film in which conductive particles are disposed in a hexagonal lattice (inclination angle γ=0°) is overlaid on a terminal row in which the terminal axes of the respective terminals are arranged in the same direction.
Figure 6A:
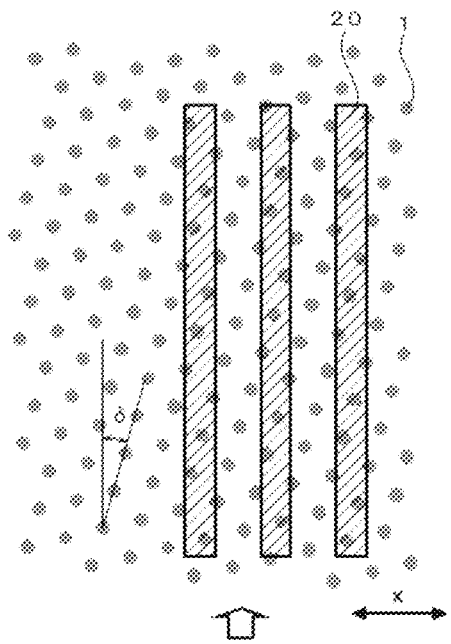
FIG. 6A is an explanatory view of a particle disposition of an anisotropic conductive film in which conductive particles are disposed in a hexagonal lattice.
Figure 6B:
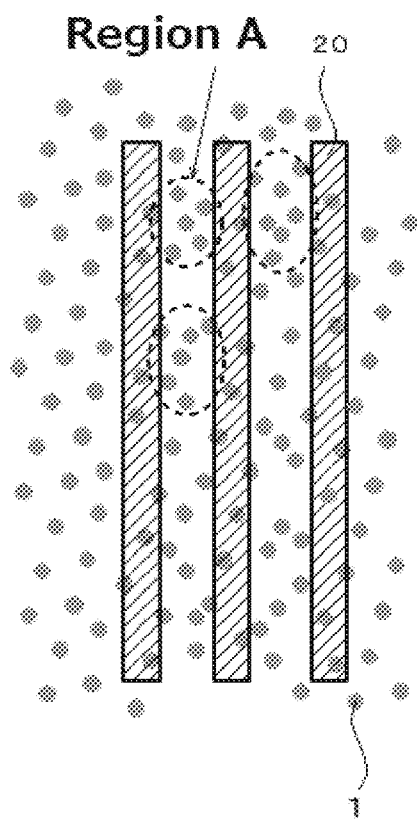
FIG. 6B is an explanatory view of a state after connecting a terminal row using an anisotropic conductive film in which conductive particles are disposed in a hexagonal lattice.
Figure 7A:
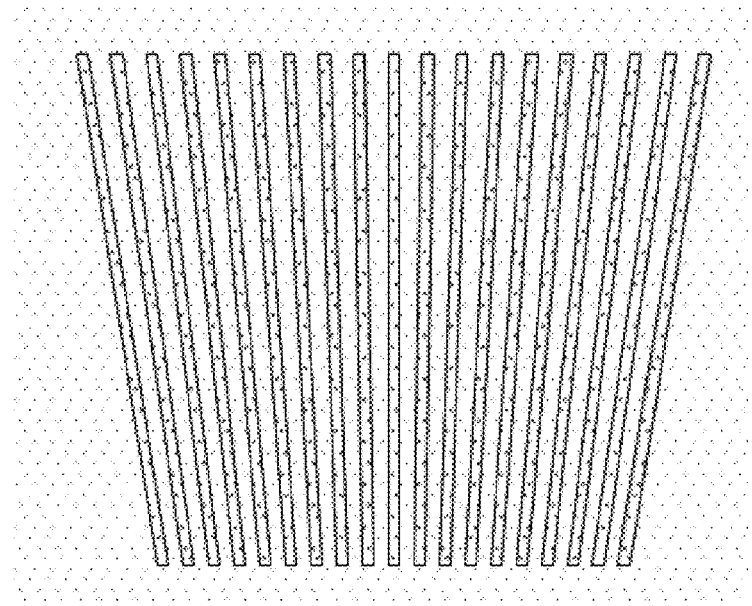
FIG. 7A shows a simulation result of a captured state of conductive particles when a fan-out type terminal arrangement is connected with substantially the same particle disposition as in Experimental Example 1.
Figure 7B:
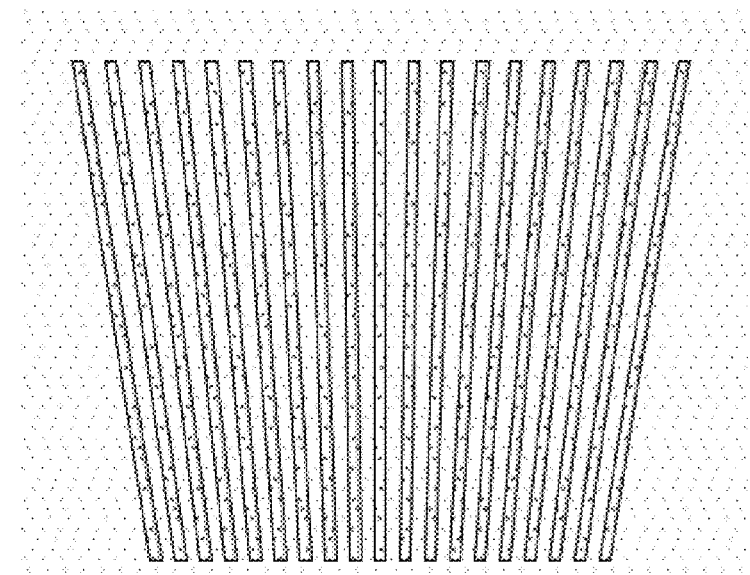
FIG. 7B shows a simulation result of a captured state of conductive particles when a fan-out type terminal arrangement is connected with substantially the same particle disposition as in Experimental Example 3.
Figure 7C:
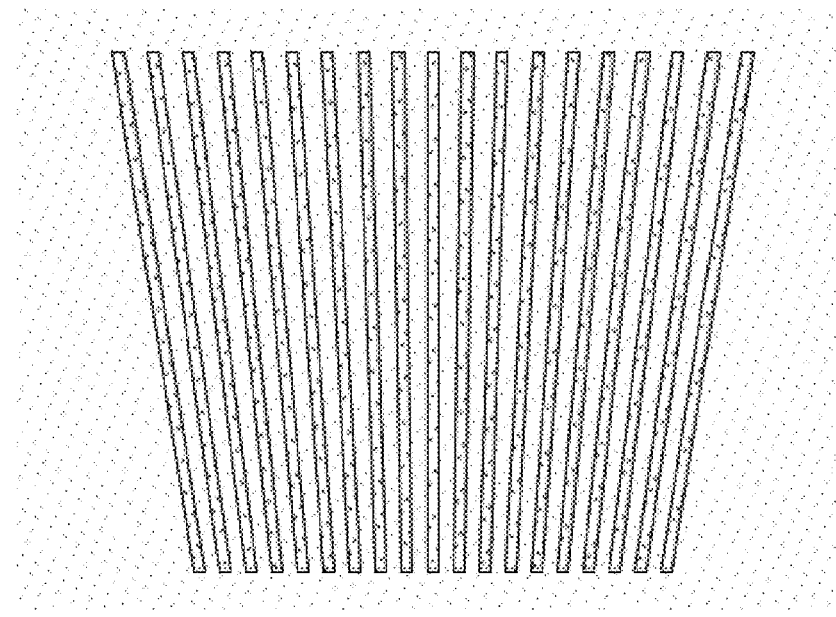
FIG. 7C shows a simulation result of a captured state of conductive particles when a fan-out type terminal arrangement is connected with substantially the same particle disposition as in Experimental Example 4.
Figure 7D:
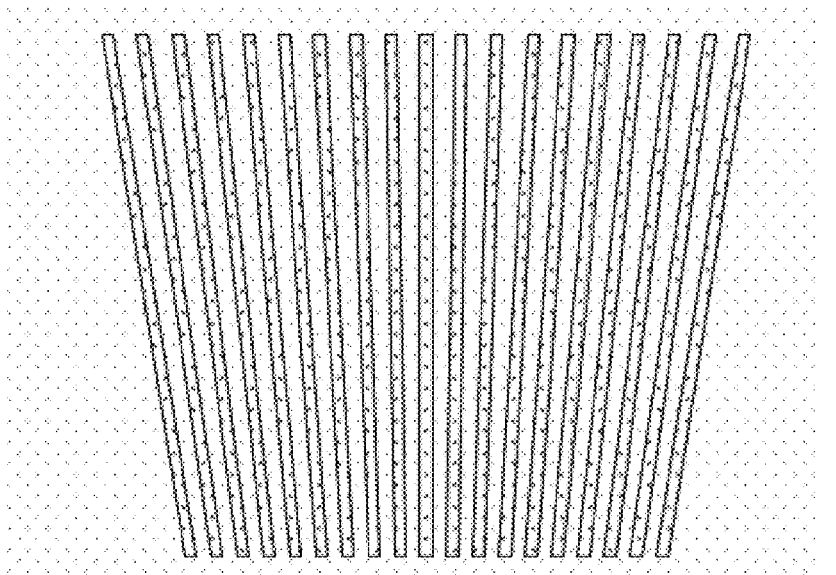
FIG. 7D shows a simulation result of a captured state of conductive particles when a fan-out type terminal arrangement is connected with substantially the same particle disposition as in Experimental Example 5.
Figure 8A:
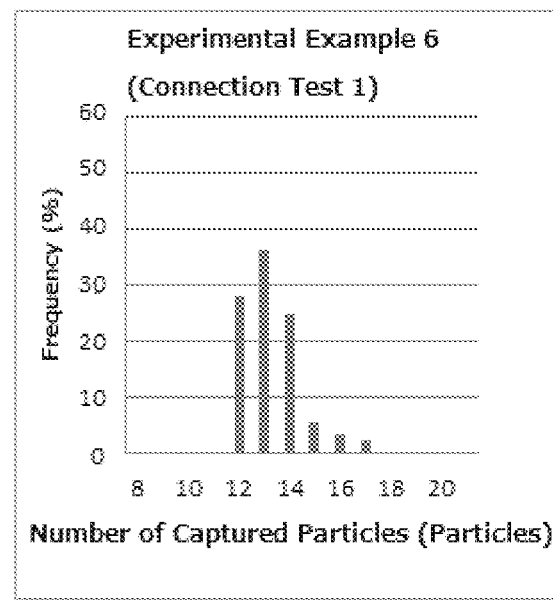
FIG. 8A is a diagram showing a relationship between the number of captured conductive particles per terminal in Connection Test 1 of Experimental Example 6 and the appearance ratio of the terminal that captures conductive particles by that captured number (frequency).
Figure 8B:
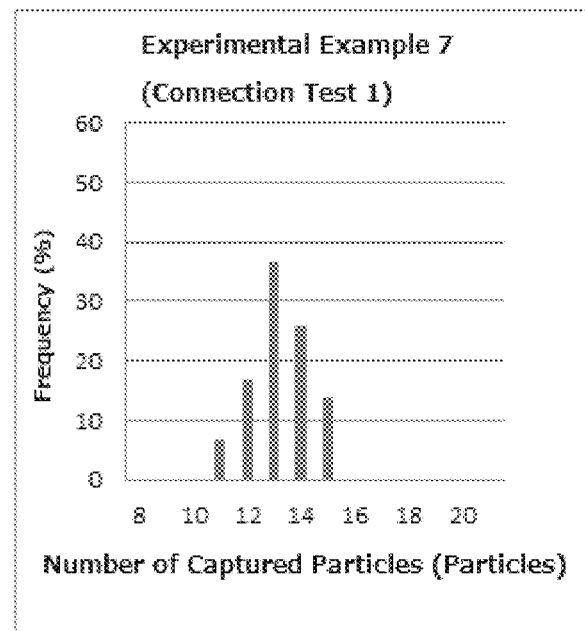
FIG. 8B is a diagram showing a relationship between the number of captured conductive particles per terminal in Connection Test 1 of Experimental Example 7 and the appearance ratio of the terminal that captures conductive particles by that captured number (frequency).
Figure 8C:
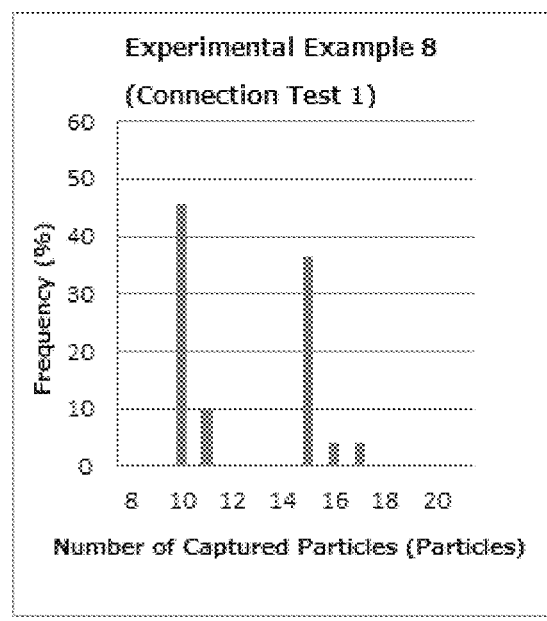
FIG. 8C is a diagram showing a relationship between the number of captured conductive particles per terminal in Connection Test 1 of Experimental Example 8 and the appearance ratio of the terminal that captures conductive particles by that captured number (frequency).
Figure 8D:
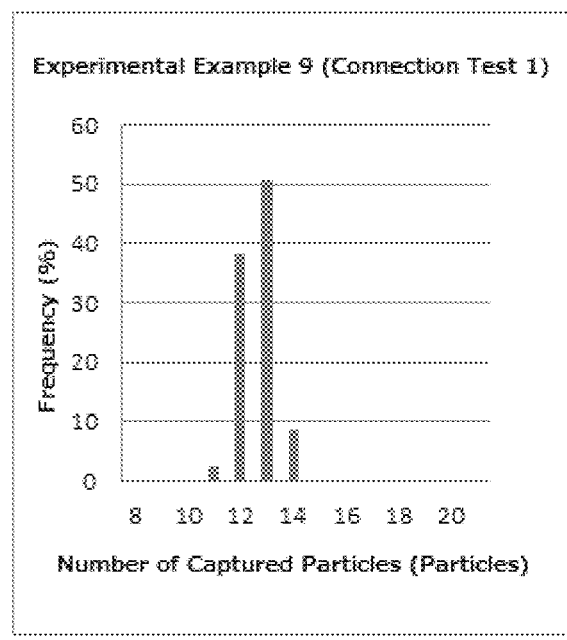
FIG. 8D is a diagram showing a relationship between the number of captured conductive particles per terminal in Connection Test 1 of Experimental Example 9 and the appearance ratio of the terminal that captures conductive particles by that captured number (frequency).
Figure 9A:
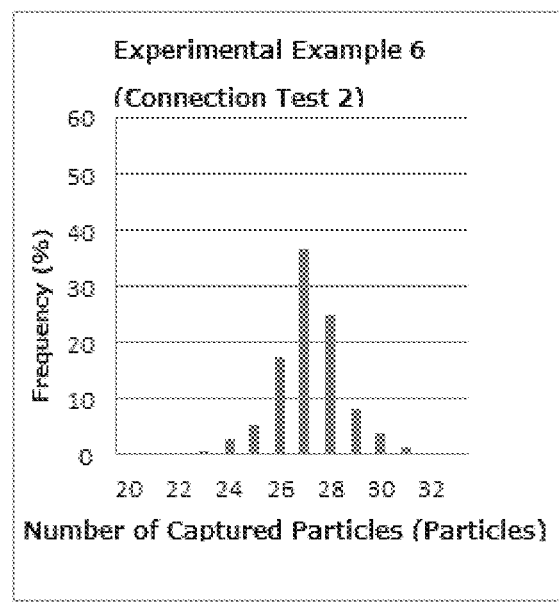
FIG. 9A is a diagram showing a relationship between the number of captured conductive particles per terminal in Connection Test 2 of Experimental Example 6 and the appearance ratio of the terminal that captures conductive particles by that captured number (frequency).
Figure 9B:
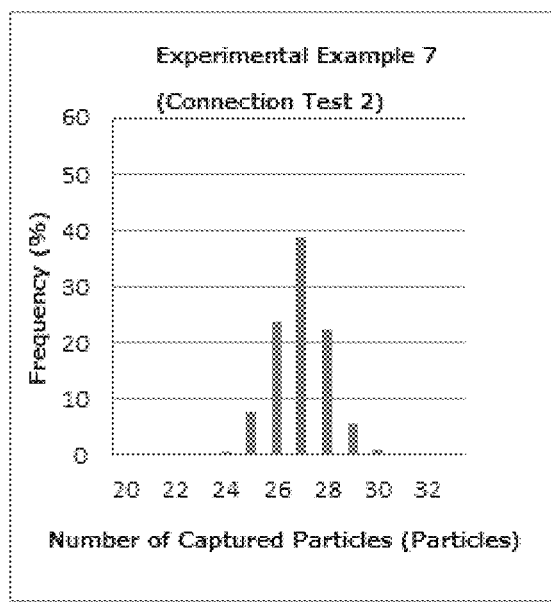
FIG. 9B is a diagram showing a relationship between the number of captured conductive particles per terminal in Connection Test 2 of Experimental Example 7 and the appearance ratio of the terminal that captures conductive particles by that captured number (frequency).
Figure 9C:
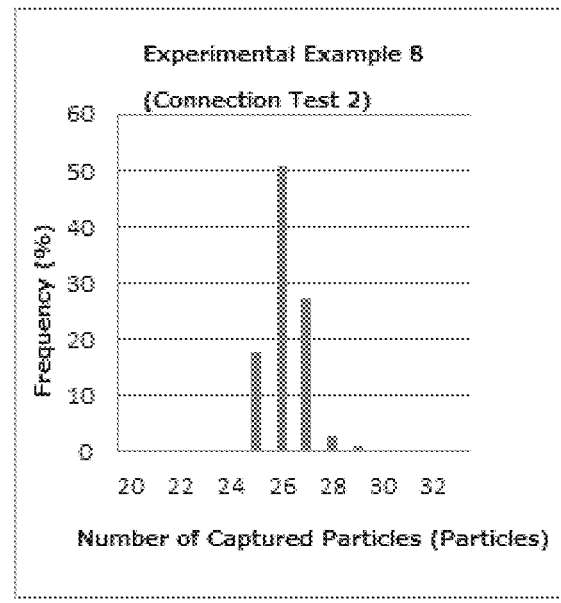
FIG. 9C is a diagram showing a relationship between the number of captured conductive particles per terminal in Connection Test 2 of Experimental Example 8 and the appearance ratio of the terminal that captures conductive particles by that captured number (frequency).
Figure 9D:
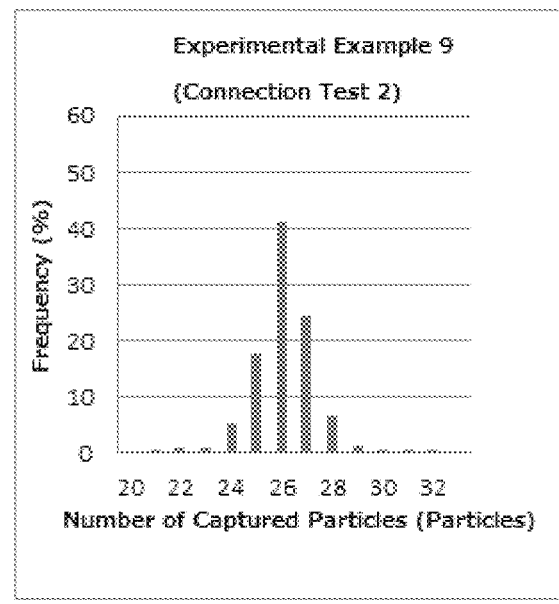
FIG. 9D is a diagram showing a relationship between the number of captured conductive particles per terminal in Connection Test 2 of Experimental Example 9 and the appearance ratio of the terminal that captures conductive particles by that captured number (frequency).

Experimental Example 8: A hexagonal lattice, in which the inclination angle of the arrangement axes with respect to the x direction is 0° as shown in FIG. 5B (particle pitch (distance between particle centers) in the x direction: 8.5 µm, number density of particles: 16000 particles/mm²).

Experimental Example 9: A hexagonal lattice, in which the inclination angle γ of the arrangement axes with respect to the x direction shown in FIG. 5A is 15° (number density of particles: 16000 particles/mm²).

Therefore, Experimental Examples 6 and 7 correspond to examples of the present invention.

TABLE 3

| Insulating Resin Layer | Phenoxy Resin (NIPPON STEEL Chemical & Material Co., Ltd., YP-50) | 40 |
|---|---|---|
| | Silica Filler (Nippon Aerosil Co., Ltd., AEROSIL R805) | 25 |
| | Liquid Epoxy Resin (Mitsubishi Chemical Corporation, jER828) | 30 |
| | Silane Coupling Agent (Shin-Etsu Chemical Co., Ltd., KBM-403) | 2 |
| | Thermal Cationic Polymerization Initiator (Sanshin Chemical Industry Co., Ltd., SI-60L) | 3 |
| Low-Viscosity Resin Layer | Phenoxy Resin (NIPPON STEEL Chemical & Material Co., Ltd., YP-50) | 40 |
| | Silica Filler (Nippon Aerosil Co., Ltd., AEROSIL R805) | 5 |
| | Liquid Epoxy Resin (Mitsubishi Chemical Corporation, jER828) | 50 |
| | Silane Coupling Agent (Shin-Etsu Chemical Co., Ltd., KBM-403) | 2 |
| | Thermal Cationic Polymerization Initiator (Sanshin Chemical Industry Co., Ltd., SI-60L) | 3 |

(Connection Test 1)

Using the anisotropic conductive film produced in each of Experimental Examples 6 to 9, the following IC for conduction evaluation having a terminal row in which the axes of respective terminals are straight and arranged in a straight manner in the same direction and the following glass substrate were connected by the following thermocompression bonding method, and the number of captured conductive particles at each terminal was counted.

IC for Conduction Evaluation
  Outer shape: 0.7×20 mm, thickness t=0.2 mm
  Terminal width: 14 μm
  Terminal length: 100 μm
  Terminal height: 12 μm
  Inter-terminal space: 14 μm
Glass Substrate
  Non-alkali glass substrate
  Electrode: ITO wiring
  Thickness: 0.7 mm
Thermocompression Bonding Method An anisotropic conductive film of each of Experimental Examples 6 to 9 was held between the IC for conduction evaluation and the glass substrate, and heated and pressurized (180° C., 60 MPa, 5 seconds) with a thermocompression bonding tool (tool width 1.0 mm) to obtain a connection structure for evaluation. In this case, in Experimental Examples 6 and 7, the a direction of the particle disposition was set to be the arrangement direction x of the terminals.

The connection structure of each of Experimental Examples 6 to 9 obtained by thermocompression bonding was observed from the glass side with a metallurgical microscope, thereby measuring the number of conductive particles captured by the individual terminals. Then, the number of captured particles per terminal (hereinafter, simply referred to as the captured number) and the number of appearance of the terminals that each capture the particles by that number were obtained. In addition, the appearance rate (hereinafter, also referred to as frequency) was obtained. The number of terminals measured is 1800 each. The results are shown in FIG. 8A to FIG. 8D.

From FIG. 8A to FIG. 8D, it can be seen that in the anisotropic conductive film of Experimental Example 8, the distribution pattern had double peaks at the captured numbers of 10 and 15, and in the anisotropic conductive film of Experimental Example 9, the captured number was concentrated at the captured numbers of 12 and 13 though they had a single peak, and the captured number was small as a whole.

In contrast, when the anisotropic conductive film of Experimental Example 6 was used, the terminal with the highest frequency captured 13 particles and appeared at its frequency of 36%, the terminal with the second highest frequency captured 12 particles and appeared at its frequency of 28%, and the terminal with the third highest frequency captured 14 particles and appeared at its frequency of 25%. The sum of these frequencies is 89%. This distribution pattern had a single peak.

Further, in the anisotropic conductive film of Experimental Example 7, the terminal with the highest frequency captured 13 particles and appeared at its frequency of 37%, the terminal with the second highest frequency captured 14 particles and appeared at its frequency of 26%, the terminal with the third highest frequency captured 12 particles and appeared at its frequency of 17%, and the terminal with the fourth highest frequency captured 15 particles and appeared at its frequency of 14%. The sum of these was 94%. This distribution pattern had also a single peak.

The minimum numbers of captured particles were 10 in Experimental Example 8 and 11 in Experimental Example 9, while 12 in Experimental Example 6 and 11 in Experimental Example 7.

In addition, when measuring the number of captured particles, it took less time to measure in Experimental Examples 6 and 7 than in Experimental Examples 8 and 9, and so the measurement was relatively easy.

From these, it can be seen that, when the anisotropic conductive connection using the anisotropic conductive film of the present invention was performed, the captured number was extremely stable in the individual terminals in the obtained connection structure.

It should be noted that both the initial conduction resistance of each of the connection structures in Experimental Examples 6 to 9 was less than 2Ω, and it was confirmed that there is no problem in practical use.

(Connection Test 2)

Figure 10A:
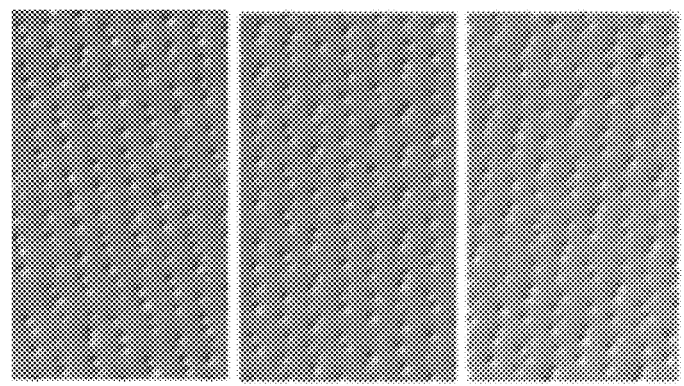
FIG. 10A is a photograph showing dents in Connection Test 2 of Experimental Example 6.
Figure 10B:
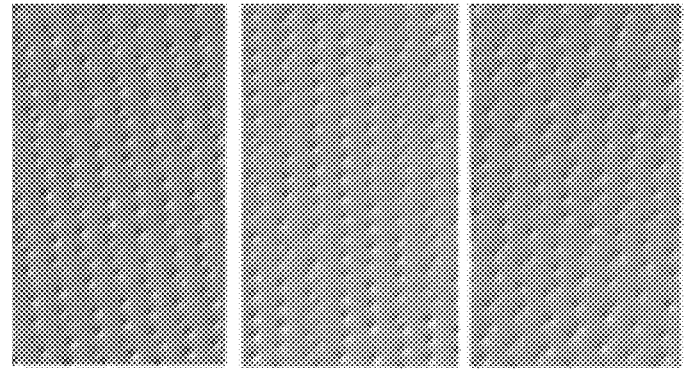
FIG. 10B is a photograph showing dents in Connection Test 2 of Experimental Example 8.
Figure 10C:
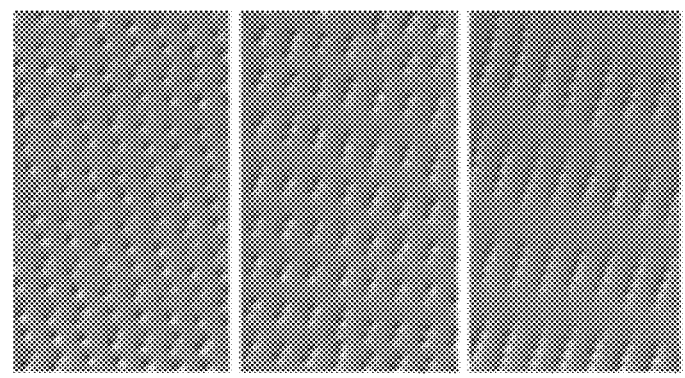
FIG. 10C is a photograph showing dents in Connection Test 2 of Experimental Example 9.

Using the anisotropic conductive film produced in each of Experimental Examples 6 to 9, the FPC for conduction evaluation having the fan-out type terminal arrangements and the glass substrate of the following specifications were connected by the same thermocompression bonding method as that in the connection test 1, the number of captured conductive particles in each terminal and the appearance rate of the terminals that each capture the particles by that number (frequency) were obtained by the same method as that in the connection test 1. The results are shown in FIG. 9A to FIG. 9D. FIG. 10A to FIG. 10C show photographs of dents after thermocompression bonding in Experimental Examples 6, 8, and 9.

FPC for Conduction Evaluation
  Polyimide film (S'perFlex, Sumitomo Metal Mining Co., Ltd.) film thickness: 38 μm, terminal height: 8 μm
  Measuring length (length of terminal used for measurement): 400 μm
  Terminal width: 8 μm
  Terminal pitch: 20 μm
  Fan-out angle: −9° to 9°
Glass Substrate
  Electrode: ITO wiring
  Thickness: 0.7 mm From FIG. 9A to FIG. 9D, it can be seen that, even when any of the anisotropic conductive films of Experimental Example 6 to Experimental Example 9 was used, the relation between the number of captured particles and the frequency showed a single peak, but the number of captured particles per terminal was larger when the anisotropic conductive films of Experimental Examples 6 and 7 were used than when those of Experimental Examples 8 and 9 were used.

Further, from FIG. 10A to FIG. 10C, compared with the case where the disposition of the conductive particles was in a hexagonal lattice (Experimental Examples 8 and 9), in accordance with the particle dispositions of the examples of the present invention, it can be seen that the uniformity of the dents on the right and left sides in the fan-out type terminal arrangement was extremely high, and thus the property of capturing the conductive particles was uniform throughout the terminal arrangement.

REFERENCE SIGNS LIST

1 conductive particle
2 insulating resin layer
3 low viscosity resin layer
10A, 10B anisotropic conductive film
11, 11a, 11b first orthorhombic lattice region 12, 12a, 12b second orthorhombic lattice region
20, 20a, 20b terminal
A dense region of conductive particles
a direction of arrangement axis
a1 arrangement axis of first orthorhombic lattice region
a2 arrangement axis of second orthorhombic lattice region
b direction of arrangement axis inclined with respect to arrangement axis a in first orthorhombic lattice region
c direction of arrangement axis inclined with respect to arrangement axis a in second orthorhombic lattice region
D average particle diameter of conductive particles
Lb embedded amount
Ld shift amount
s strain amount
x arrangement direction of terminals
y direction perpendicular to a direction
pa particle pitch in arrangement axis a
α angle formed between a and b directions
β fan-out angle when using a fan-out arrangement, or an angle formed between the arrangement direction of terminals and a long-side direction of terminal when using a not-fan-out arrangement
γ inclination angle of arrangement axis of hexagonal lattice with respect to x direction

The invention claimed is:

1. An anisotropic conductive film in which conductive particles are disposed in an insulating resin layer, wherein the anisotropic conductive film comprises:
a plurality of first orthorhombic lattice regions in each of which a plurality of arrangement axes (a1) of the conductive particles which are disposed in an a direction at a predetermined pitch are arranged in a b direction inclined with respect to the a direction at an angle α, and
a plurality of second orthorhombic lattice regions in each of which a plurality of arrangement axes (a2) of the conductive particles which are disposed in the a direction at a predetermined pitch are arranged in a c direction obtained by inverting the b direction with respect to the a direction.

2. The anisotropic conductive film according to claim 1, wherein each first orthorhombic lattice region and the second orthorhombic lattice region are disposed such that an extension of the arrangement axis, of the arrangement axes inclined with respect to the a direction, in one of the orthorhombic lattice regions never serves as the arrangement axis in the other orthorhombic lattice region.

3. The anisotropic conductive film according to claim 1, wherein each first orthorhombic lattice region and the second orthorhombic lattice region are alternately disposed.

4. The anisotropic conductive film according to claim 1, wherein the conductive particles are disposed at a constant pitch in each of the arrangement axes (a1) in each first orthorhombic lattice region and the arrangement axes (a2) in each second orthorhombic lattice region.

5. The anisotropic conductive film according to claim 4, wherein the pitch at which the conductive particles are disposed in the arrangement axis (a1) in each first orthorhombic lattice region is equal to the pitch at which the conductive particles are disposed in the arrangement axis (a2) in each second orthorhombic lattice region.

6. The anisotropic conductive film according to claim 1, wherein a distance (L1) between adjacent arrangement axes (a1) in each first orthorhombic lattice region is equal to a distance (L2) between adjacent arrangement axes (a2) in each second orthorhombic lattice region.

7. The anisotropic conductive film according to claim 3, wherein the conductive particles in the arrangement axis (a1) in each first orthorhombic lattice region and the conductive particles in the arrangement axis (a2) in each second orthorhombic lattice region are shifted in position in the a direction, the arrangement axis (a1) in each first orthorhombic lattice region and the arrangement axis (a2) in each second orthorhombic lattice region being adjacent to each other.

8. The anisotropic conductive film according to claim 7, wherein a shift amount (Ld) of the conductive particles in the a direction in the arrangement axis (a1) in each first orthorhombic lattice region and the arrangement axis (a2) in each second orthorhombic lattice region, which are adjacent to each other, is larger than an average particle diameter of the conductive particles.

9. The anisotropic conductive film according to claim 1, wherein an arrangement number of the arrangement axes (a1) in each first orthorhombic lattice region is equal to an arrangement number of the arrangement axes (a2) in each second orthorhombic lattice region.

10. The anisotropic conductive film according to claim 1, wherein an arrangement number of the arrangement axes (a1) in each first orthorhombic lattice region and an arrangement number of the arrangement axes (a2) in each second orthorhombic lattice region are 4 or less.

11. The anisotropic conductive film according to claim 1, wherein the arrangement axis (a1) is parallel to a long-side direction of the anisotropic conductive film.

12. The anisotropic conductive film according to claim 3, wherein a repetition pitch of each first orthorhombic lattice region and each second orthorhombic lattice region in a direction perpendicular to the a direction is equal to or less than a terminal length of a terminal to be connected.

13. A method of producing a connection structure comprising connecting a terminal of a first electronic component and a terminal of a second electronic component using the anisotropic conductive film according to claim 1 by anisotropic conductive connection.

14. A connection structure in which a first electronic component and a second electronic component are connected by anisotropic conductive connection through the anisotropic conductive film according to claim 1.

15. The anisotropic conductive film according to claim 1, wherein a low-viscosity resin layer is laminated on the insulating resin layer.

16. The anisotropic conductive film according to claim 1, wherein the conductive particles are metal particles or metal-coated resin particles.

17. The anisotropic conductive film according to claim 1, wherein the conductive particles are coated with an insulating resin.

* * * * *